USO10559591B2

United States Patent
Kanamori et al.

(10) Patent No.: US 10,559,591 B2
(45) Date of Patent: Feb. 11, 2020

(54) VERTICAL MEMORY DEVICES AND METHODS OF MANUFACTURING THE SAME

(71) Applicant: Samsung Electronics Co., Ltd., Suwon-si, Gyeonggi-do (KR)

(72) Inventors: Kohji Kanamori, Seoul (KR); Young-Hwan Son, Hwaseong-si (KR); Byung-Kwan You, Seoul (KR); Eun-Taek Jung, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/118,647

(22) Filed: Aug. 31, 2018

(65) Prior Publication Data

US 2019/0157294 A1 May 23, 2019

(30) Foreign Application Priority Data

Nov. 21, 2017 (KR) .................. 10-2017-0155722

(51) Int. Cl.
| | |
|---|---|
| *H01L 27/11582* | (2017.01) |
| *H01L 21/28* | (2006.01) |
| *H01L 21/56* | (2006.01) |
| *H01L 21/764* | (2006.01) |
| *H01L 21/768* | (2006.01) |

(Continued)

(52) U.S. Cl.
CPC ...... *H01L 27/11582* (2013.01); *H01L 21/565* (2013.01); *H01L 21/764* (2013.01); *H01L 21/76832* (2013.01); *H01L 23/5329* (2013.01); *H01L 29/40117* (2019.08); *H01L 29/4234* (2013.01)

(58) Field of Classification Search
None
See application file for complete search history.

(56) References Cited

U.S. PATENT DOCUMENTS

| | | |
|---|---|---|
| 7,875,922 B2 | 1/2011 | Arai et al. |
| 8,952,438 B2 | 2/2015 | Shim et al. |

(Continued)

FOREIGN PATENT DOCUMENTS

WO  WO-2017087670 A1  5/2017

OTHER PUBLICATIONS

Office Acton dated Mar. 5, 2019, issued in corresponding Singapore Patent Application No. 10201807976T.

(Continued)

*Primary Examiner* — Andres Munoz
(74) *Attorney, Agent, or Firm* — Harness, Dickey & Pierce, P.L.C.

(57) ABSTRACT

A vertical memory device includes first, second and third impurity regions sequentially stacked in a first direction substantially perpendicular to an upper surface of a substrate, a gate electrode structure including gate electrodes spaced apart from each other in the first direction on the third impurity region, a channel extending through the gate electrode structure, the second and third impurity regions, and an upper portion of the first impurity region on the substrate in the first direction, and a charge storage structure covering a portion of an outer sidewall and a lower surface of the channel. The channel directly contacts a sidewall of the second impurity region.

18 Claims, 21 Drawing Sheets

(51) Int. Cl.
*H01L 23/532* (2006.01)
*H01L 29/423* (2006.01)

(56) References Cited

U.S. PATENT DOCUMENTS

| | | |
|---|---|---|
| 9,099,527 B2 | 8/2015 | Yoo |
| 9,209,031 B2 | 12/2015 | Baenninger et al. |
| 9,245,962 B1 | 1/2016 | Yang et al. |
| 9,276,011 B2 | 3/2016 | Simsek-Ege et al. |
| 9,627,405 B1 | 4/2017 | Lee |
| 9,985,098 B2* | 5/2018 | Matsumoto ....... H01L 27/11565 |
| 10,186,521 B2* | 1/2019 | Fukumoto ......... H01L 27/11582 |
| 10,263,010 B2* | 4/2019 | Choi ................ H01L 27/11582 |
| 2011/0287612 A1 | 11/2011 | Lee et al. |
| 2012/0068255 A1* | 3/2012 | Lee .................. H01L 27/11582 257/324 |
| 2016/0079272 A1 | 3/2016 | Lee et al. |
| 2016/0181264 A1 | 6/2016 | Miyamoto et al. |
| 2016/0247814 A1 | 8/2016 | Lai et al. |
| 2017/0084696 A1 | 3/2017 | Lee et al. |
| 2017/0133389 A1 | 5/2017 | Yun et al. |
| 2017/0148811 A1 | 5/2017 | Zhang et al. |
| 2017/0162591 A1 | 6/2017 | Choi |
| 2017/0162594 A1 | 6/2017 | Ahn |
| 2017/0317099 A1 | 11/2017 | Huang et al. |
| 2018/0366483 A1* | 12/2018 | Choi ................ H01L 27/11556 |
| 2018/0366488 A1* | 12/2018 | Choi ................ H01L 27/11582 |

OTHER PUBLICATIONS

Extended European Search Report dated Apr. 18, 2019 in corresponding European Patent Application No. 18200730.2.
C. Serra et al., "Synthesis of SiC Microstructures in Si Technology by High Dose Carbon Implantation: Etch-Stop Properties" J. Electrochemical Society, vol. 144, No. 6 (1997).

* cited by examiner

VERTICAL MEMORY DEVICES AND METHODS OF MANUFACTURING THE SAME

CROSS-REFERENCE TO RELATED APPLICATIONS

This application claims priority under 35 USC § 119 to Korean Patent Application No. 10-2017-0155722, filed on Nov. 21, 2017 in the Korean Intellectual Property Office (KIPO), the contents of which are herein incorporated by reference in their entirety.

BACKGROUND

1. Field

The inventive concepts relate to vertical memory devices and methods of manufacturing the same.

2. Description of the Related Art

As the stack number of a mold structure in a VNAND flash memory device increases, the channel hole extending through the mold structure may be bent. An ONO layer may be formed on an inner wall of the channel hole, a portion of the ONO layer on an upper surface of a substrate may be removed by a dry etching process using a spacer on a sidewall of the ONO layer as an etching mask to expose the upper surface of the substrate, and a channel may be formed on the ONO layer to be connected to the exposed upper surface of the substrate. Due to the bending of the channel hole, connecting the channel to the substrate may be difficult.

SUMMARY

Example embodiments provide a vertical memory device having improved characteristics.

Example embodiments provide a method of manufacturing a vertical memory device having improved characteristics.

According to an aspect of the inventive concepts, there is provided a vertical memory device. The vertical memory device may include first, second and third impurity regions sequentially stacked in a first direction substantially perpendicular to an upper surface of a substrate, a gate electrode structure including gate electrodes spaced apart from each other in the first direction on the third impurity region, a channel extending through the gate electrode structure, the second and third impurity regions, and an upper portion of the first impurity region on the substrate in the first direction, and a charge storage structure covering a portion of an outer sidewall and a lower surface of the channel. The channel may directly contact a sidewall of the second impurity region.

According to an aspect of the inventive concepts, there is provided a vertical memory device. The vertical memory device may include first, second and third impurity regions sequentially stacked in a first direction substantially perpendicular to an upper surface of a substrate, a gate electrode structure including gate electrodes spaced apart from each other in the first direction on the third impurity region, a channel extending through the gate electrode structure and the second and third impurity regions on the substrate in the first direction, a charge storage structure covering a portion of an outer sidewall of the channel, and a support pattern between the first and third impurity regions. At least a portion of the channel may contact the second impurity region, and the support pattern may contact a sidewall of the second impurity region and an edge lower surface of the third impurity region.

According to an aspect of the inventive concepts, there is provided a vertical memory device. The vertical memory device may include an impurity region structure including polysilicon doped with impurities on a substrate, a gate electrode structure including gate electrodes spaced apart from each other in a first direction substantially parallel to an upper surface of the substrate on the impurity region structure, a channel extending through the gate electrode structure and at least a portion of the impurity region structure on the substrate in the first direction, and a charge storage structure covering a second portion of the outer sidewall and a lower surface of the channel. A first portion of an outer sidewall of the channel may directly contact the impurity region structure, and the second portion of the outer sidewall of the channel may not directly contact the impurity region structure.

According to an aspect of the inventive concepts, there is provided a method of manufacturing a vertical memory device. In the method, a first etch stop layer, a first sacrificial layer, and a second etch stop layer may be sequentially formed on a substrate. A mold including an insulation layer and a second sacrificial layer alternately and repeatedly stacked may be formed on the second etch stop layer. A channel extending through the mold, the second etch stop layer, the first sacrificial layer and an upper portion of the first etch stop layer, and a charge storage structure covering an outer sidewall and a lower surface of the channel may be formed. An opening may be formed through the mold and the second etch stop layer to expose the first sacrificial layer. The first sacrificial layer may be removed through the opening to form a gap exposing a portion of the charge storage structure. The exposed portion of the charge storage structure may be removed to expose a portion of the outer sidewall of the channel. A filling pattern contacting the exposed portion of the outer sidewall of the channel may be removed to fill the gap. The second sacrificial layer may be replaced with a gate electrode.

According to an aspect of the inventive concepts, there is provided a method of manufacturing a vertical memory device. In the method, a first impurity region and a first sacrificial layer may be sequentially formed on a substrate. Impurities may be doped into a portion of the first sacrificial layer by an ion implantation process to form a support pattern. A mold including an insulation layer and a second sacrificial layer alternately and repeatedly stacked may be formed on the first sacrificial layer and the support pattern. A channel extending through the mold, the first sacrificial layer and an upper portion of the first impurity region, and a charge storage structure covering an outer sidewall and a lower surface of the channel may be formed. An opening may be formed through the mold to expose the first sacrificial layer and the support pattern. The first sacrificial layer may be removed through the opening to form a gap exposing a portion of the charge storage structure. The exposed portion of the charge storage structure may be removed to expose a portion of the outer sidewall of the channel. A second impurity region contacting the exposed portion of the outer sidewall of the channel may be formed to fill the gap. The second sacrificial layer may be replaced with a gate electrode.

In the vertical memory device in accordance with example embodiments, even if the stack number of the gate electrodes increases, the channel extending through the gate electrodes and the CSL may be electrically connected with each other.

DETAILED DESCRIPTION

The above and other aspects and features of the vertical memory devices and the methods of manufacturing the same in accordance with example embodiments will become readily understood from detail descriptions that follow, with reference to the accompanying drawings.

Figure 1:
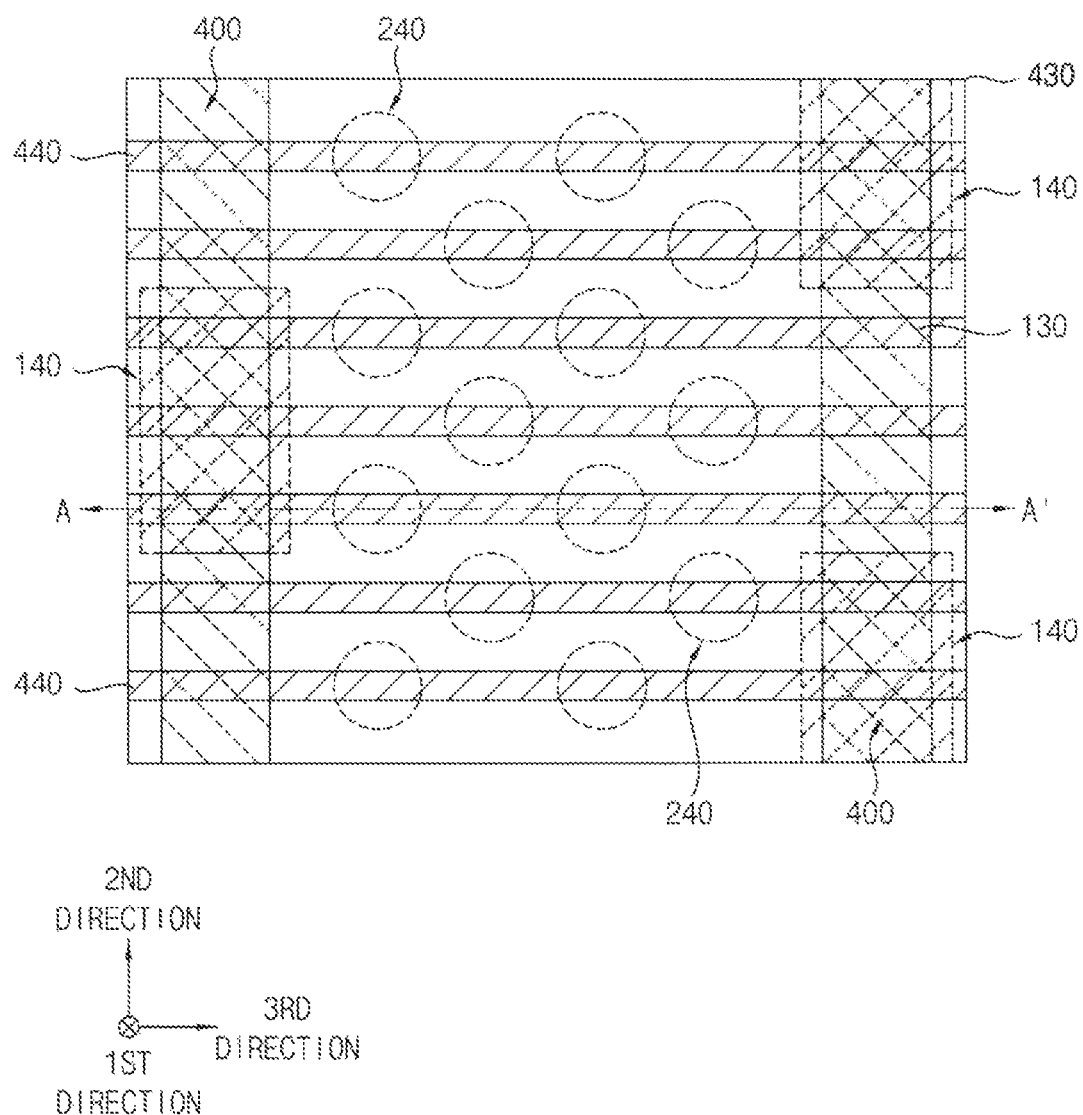
FIGS. 1 to 3 are a plan view and cross-sectional views illustrating a vertical memory device in accordance with example embodiments.
Figure 2:
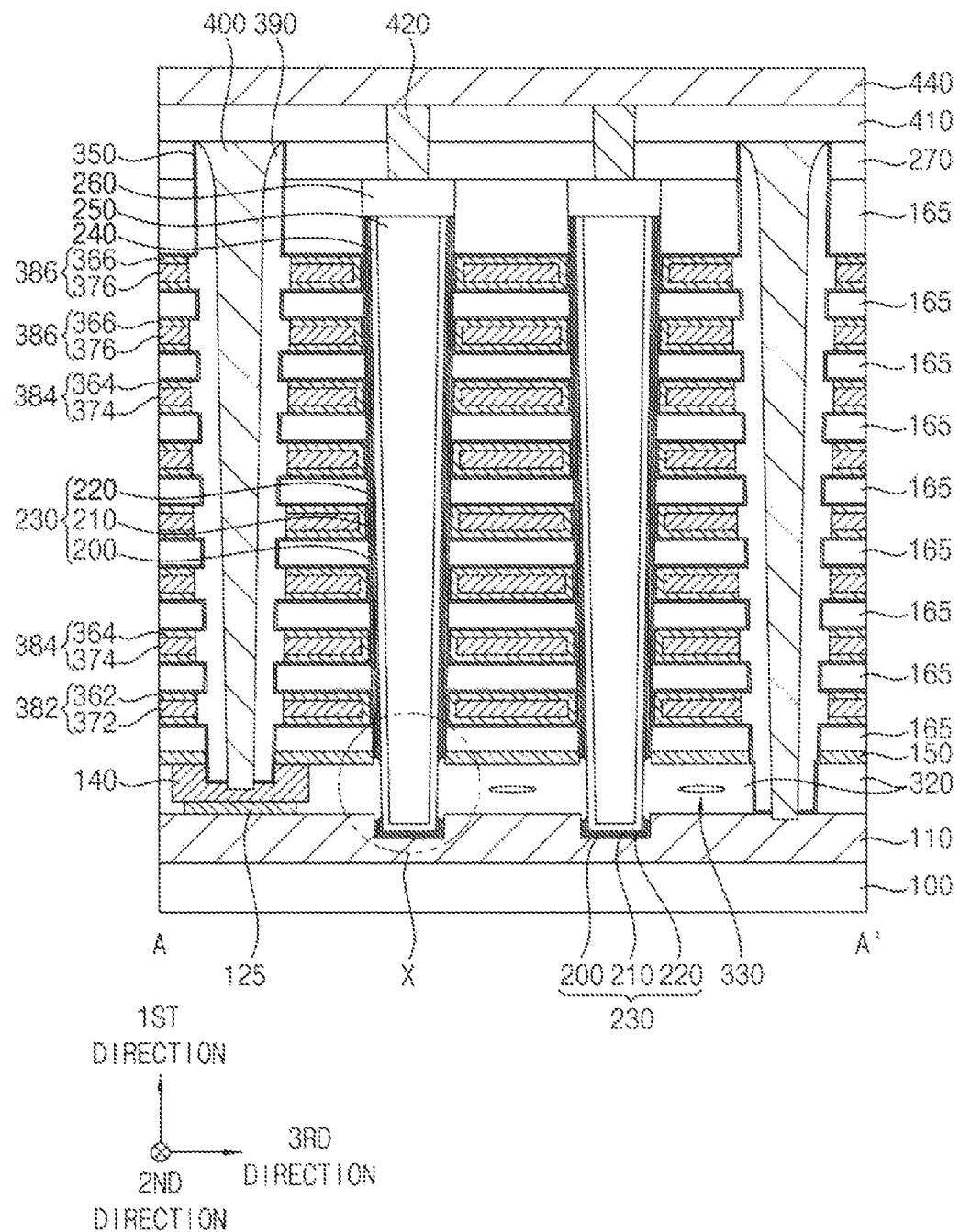
Figure 3:
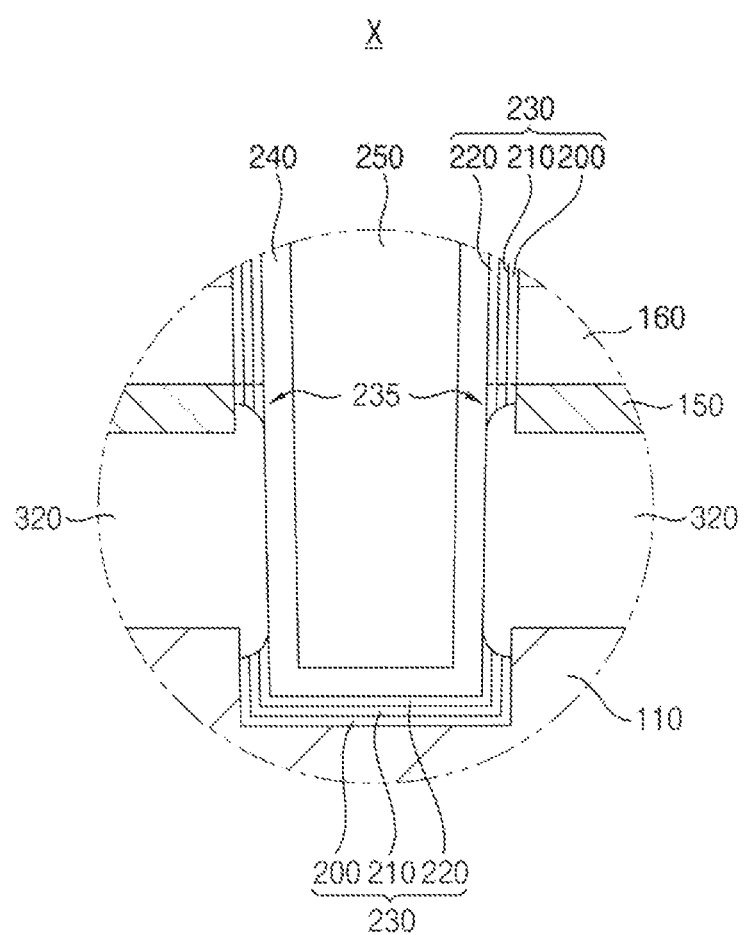

FIGS. 1 to 3 are a plan view and cross-sectional views illustrating a vertical memory device in accordance with example embodiments. Particularly, FIG. 1 is a plan view, FIG. 2 is a cross-sectional view taken along a line A-A' of FIG. 1, and FIG. 3 is an enlarged cross-sectional view of a region X of FIG. 2.

Hereinafter, a direction substantially perpendicular to an upper surface of a substrate may be defined as a first direction, and two directions substantially parallel to the upper surface of the substrate and crossing each other may be defined as second and third directions, respectively. In example embodiments, the second and third directions may be substantially perpendicular to each other.

Referring to FIGS. 1 to 3, the vertical memory device may include an impurity region structure, a support pattern 140, a gate electrode structure, an insulation pattern structure, a charge storage structure 230, and a channel 240. The vertical memory device may further include a diffusion prevention pattern 125, a first filling pattern 250, a capping pattern 260, a second blocking pattern 350, a second spacer 390, a common source line (CSL) 400, a contact plug 420, a bit line 440, and first to third insulating interlayers 270, 410 and 430.

The substrate 100 may include silicon, germanium, silicon-germanium or a III-V compound such as GaP, GaAs, GaSb, etc. In some example embodiments, the substrate 100 may be a silicon-on-insulator (SOI) substrate or a germanium-on-insulator (GOI) substrate.

The impurity region structure may include first, second and third impurity regions 110, 320 and 150 sequentially stacked on the substrate 100.

The first impurity region 110 may contact an upper surface of the substrate 100, and when a first gap 310 (refer to FIG. 13) for the second impurity region 320 is formed, the first impurity region 110 may impede or prevent the substrate 100 from being etched, and thus may be also referred to as a first etch stop layer 110.

In an example embodiment, the first impurity region 110 may include n-type impurities, e.g., phosphorus, arsenic, etc., and polysilicon doped with carbon. The n-type impurities may have a high doping concentration of, e.g., about $1 \times 10^{18}$ cm$^{-3}$ to about $1 \times 10^{20}$ cm$^{-3}$. Alternatively, the first impurity region 110 may include polysilicon doped with n-type impurities, e.g., phosphorus, arsenic, etc.

Alternatively, the first impurity region 110 may include p-type impurities, e.g., boron, aluminum, etc., and polysilicon doped with carbon. The p-type impurities may have a doping concentration of, e.g., about $1 \times 10^{16}$ cm$^{-3}$ to about $1 \times 10^{18}$ cm$^{-3}$. Alternatively, the first impurity region 110 may include polysilicon doped with p-type impurities, e.g., boron, aluminum, etc.

The second impurity region 320 may contact an upper surface of the first impurity region 110, and may fill the first gap 310, which may be also referred to as a second filling pattern 320. In some example embodiments, the first gap 310 may not completely filled with the second impurity region 320, and an air gap 330 may be formed in the second impurity region 320.

The second impurity region 320 may include polysilicon doped with impurities having the same conductivity type as that of the impurities doped into the first impurity region 110. That is, when the first impurity region 110 includes n-type impurities, the second impurity region 320 may include polysilicon doped with n-type impurities, and the n-type impurities may have a high doping concentration of, e.g., about $1 \times 10^{18}$ cm$^{-3}$ to about $1 \times 10^{20}$ cm$^{-3}$. When the first impurity region 110 includes p-type impurities, the second impurity region 320 may include polysilicon doped with p-type impurities, and the p-type impurities may have a doping concentration of, e.g., about $1 \times 10^{16}$ cm$^{-3}$ to about $1 \times 10^{18}$ cm$^{-3}$.

The third impurity region 150 may contact an upper surface of the second impurity region 320, and when the first gap 310 is formed, the third impurity region 150 may impede or prevent the overlying insulation pattern 165 from being etched, and thus may be also referred to as a second etch stop layer 150.

In example embodiments, at least a portion of a sidewall of the third impurity region 150 facing an outer sidewall of the channel 240 may contact the second impurity region 320. That is, an edge of the second impurity region 320 contacting the outer sidewall of the channel 240 may protrude upwardly and downwardly along the first direction from a portion of the second region 320 under the third impurity region 150, so as to contact the sidewall of the third impurity region 150. An upper surface of the edge of the second impurity region 320 may become higher as a distance from the channel 240 increases, and a lower surface of the edge of the second impurity region 320 may become lower as a distance from the channel 240 increases.

In example embodiments, the third impurity region 150 may include carbon, and polysilicon doped with n-type impurities or p-type impurities. The n-type impurities or the p-type impurities doped into the third impurity region 150 may have the same conductivity type as that of the impurities doped into the second impurity region 320.

The support pattern 140 may be formed on the first impurity region 110 at the same level as that of the second impurity region 320. The support pattern 140 may contact a lower surface of an edge of the third impurity region 150, and when the first gap 310 is formed, the support pattern 140 may support upper structures thereon.

In example embodiments, the support pattern 140 may vertically overlap an area of an opening 290 (refer to FIGS. 10 and 11) for the gate electrode structure and the CSL 400. The opening 290 may extend in the second direction, and a plurality of openings 290 may be formed in the third direction. Thus, one or a plurality of support patterns 140 may be formed in the second direction, and a plurality of support patterns 140 may be formed in the third direction. The support pattern 140 may have various shapes of, e.g., rectangle, circle, ellipse, polygon, etc., in a plan view.

In an example embodiment, the support pattern 140 may include polysilicon doped with carbon. Alternatively, the support pattern 140 may include carbon and polysilicon doped with n-type impurities or p-type impurities.

The diffusion prevention pattern 125 may be formed between the first etch stop layer 110 and the support pattern 140. The diffusion prevention pattern 125 may be a remaining portion of a diffusion prevention layer 120 (refer to FIG. 5), which may be formed on the first impurity region 110 and prevent impurities of the first impurity region 110 from diffusing upwardly, after etching a portion of the charge storage structure 230 exposed by the first gap 310. Thus, the diffusion prevention pattern 125 may cover a central lower surface of the support pattern 140 in the third direction.

The diffusion prevention pattern 125 may include an oxide, e.g., silicon oxide, or a nitride, e.g., silicon nitride.

The gate electrode structure may include a plurality of gate electrodes at a plurality of levels, respectively, spaced apart from each other in the first direction on the third impurity region 150. The gate electrode structure may extend in the second direction, and a plurality of gate electrode structures may be formed in the third direction. That is, neighboring ones of the gate structures in the third direction at each level, each of which may extend in the second direction, may be spaced apart from each other by the opening 290 extending in the second direction.

In example embodiments, the CSL 400 may be formed in the opening 290 to extend in the second direction, and the second spacer 390 may be formed on each of opposite sidewalls of the CSL in the third direction. In example embodiments, a lower surface of the CSL 400 may contact the first impurity region 110 and the support pattern 140, and may be covered by the first impurity region 110 and the support pattern 140.

The CSL 400 may include a metal, a metal nitride, and/or a metal silicide, and the second spacer 390 may include an oxide, e.g., silicon oxide.

Each of the gate electrode structures may include at least one first gate electrode 382, a plurality of second gate electrodes 384 at a plurality of levels, respectively, and at least one third gate electrode 386, which may be sequentially stacked in the first direction.

FIG. 2 shows one first gate electrode 382 at one level, five second gate electrodes 384 at five levels, respectively, and two third gate electrodes 386 at two levels, respectively, however, the inventive concepts may not be limited thereto. For example, two first gate electrodes 382 may be formed at two levels, respectively, and more than five second gate electrodes 384 may be formed at more than five levels, respectively.

In example embodiments, the first gate electrode 382 may serve as a ground selection line (GSL), each of the second gate electrodes 384 may serve as a word line, and the third gate electrode 386 may serve as a string selection line (SSL). Some of the second gate electrodes 384 adjacent the first gate electrode 382 and/or the third gate electrode 386 may serve as a dummy word line.

The first gate electrode 382 may include a first gate conductive pattern 372 extending in the second direction and a first gate barrier pattern 362 covering upper and lower surfaces and a sidewall of the first gate conductive pattern 372, the second gate electrode 384 may include a second gate conductive pattern 374 extending in the second direction and a second gate barrier pattern 364 covering upper and lower surfaces and a sidewall of the second gate conductive pattern 374, and the third gate electrode 386 may include a third gate conductive pattern 376 extending in the second direction and a third gate barrier pattern 366 covering upper and lower surfaces and a sidewall of the third gate conductive pattern 376.

The first to third gate conductive patterns 372, 374 and 376 may include a metal having a low resistance, e.g., tungsten, titanium, tantalum, platinum, etc., and the first to third gate barrier patterns 362, 364 and 366 may include a metal nitride, e.g., titanium nitride, tantalum nitride, etc.

The insulation pattern structure may include a plurality of insulation patterns 165 sequentially stacked on the third impurity region 150 in the first direction. The insulation patterns 165 may be formed between an upper surface of the third impurity region 150 and the first gate electrode 382, between the first to third gate electrodes 382, 384 and 386 adjacent to each other in the first direction, and on the third gate electrode 386.

In example embodiments, each of the insulation patterns 165 at a plurality of levels, respectively, may extend in the second direction, and a plurality of insulation patterns 165 at each level may be spaced apart from each other in the third direction by the opening 290. The insulation patterns 165 may include an oxide, e.g., silicon oxide.

Some of the plurality of insulation patterns 165 may have a thickness greater than those of others of the plurality of insulation patterns 165. For example, an uppermost one of the insulation patterns 165 may have a thickness greater than those of other ones of the insulation patterns 165, however, the inventive concepts may not be limited thereto.

The channel 240 may extend in the first direction through the gate electrode structure, the second and third impurity regions 320 and 150, and an upper portion of the first impurity region 110 on the substrate 100, and may have a cup-like shape. In example embodiments, a first portion of an outer sidewall of the channel 240 may contact the second impurity region 320.

A plurality of channels 240 may be formed in each of the second and third directions, and thus a channel array may be defined. In example embodiments, the channel array may include a first channel column including first channels disposed in the second direction, and a second channel column including second channels disposed in the second direction and being spaced apart from the first channel column in the third direction. The first and second channel columns may be alternately disposed in the third direction. The second channels may be disposed to have acute angles with the second direction or the third direction from the first channels, and the first and second channels may be arranged in a zigzag layout along the second direction. FIG. 1 shows that two first channel columns and two second channel columns are alternately arranged in the third direction between neighboring two CSLs 400, however, the inventive concepts need not be limited thereto.

The channel 240 may include, e.g., undoped polysilicon, or polysilicon lightly doped with n-type impurities or p-type impurities.

The charge storage structure 230 may cover a portion of an outer sidewall and a lower surface of the channel 240. In example embodiments, the charge storage structure 230 may cover other portions of the outer sidewall of the channel 240 except for the first portion directly contacting the second impurity region 320 (hereinafter, the other portions of the outer sidewall of the channels 240 may be referred to as a second portion) and the lower surface of the channel 240.

Thus, the charge storage structure 230 may include a third portion higher than the second impurity region 320, and a fourth portion lower than the second impurity region 320 and spaced apart from the third portion in the first direction. The fourth portion of the charge storage structure 230 may cover the lower surface and a lower outer sidewall of the channel 240, and may extend through an upper portion of the first etch stop layer 110.

In example embodiments, a lower surface of the third portion and an upper surface of the fourth portion of the charge storage structure 230 may contact the edge of the second impurity region 320. According to the shape of the edge of the second impurity region 320, the lower surface of the third portion of the charge storage structure 230 may become higher as a distance from the channel 240 increases, and the upper surface of the fourth portion of the charge storage structure 230 may become lower as a distance from the channel 240 increases.

As shown in FIG. 3, a lower portion of the third portion of the charge storage structure 230 may be disposed between upper and lower surfaces of the third impurity region 150, and hereinafter, may be referred to as a protrusion 235. The protrusion 235 may contact the outer sidewall of the channel 240 and an upper surface of the edge of the second impurity region 320, and may partially contact the third impurity region 150.

Accordingly, the protrusion 235 of the charge storage structure 230 may be formed between the channel 240 and the second and third impurity regions 320 and 150 each of which may include conductive polysilicon, and thus a parasitic capacitance may be generated. However, in accordance with example embodiments, the third impurity region 150 may have a thin thickness of about 5 nm to about 50 nm, and thus the protrusion 235 of the charge storage structure 230 may have a small length in the first direction. As a result, the parasitic capacitance generated by the protrusion 235 of the charge storage structure 230 may be small.

The charge storage structure 230 may include a tunnel insulation pattern 220, a charge storage pattern 210, and a first blocking pattern 200 sequentially stacked on the outer sidewall of the channel 240.

The tunnel insulation pattern 220 and the first blocking pattern 200 may include an oxide, e.g., silicon oxide, and the charge storage pattern 210 may include a nitride, e.g., silicon nitride.

The first filling pattern 250 may fill an inner space formed by the channel 240. That is, a lower surface and a sidewall of the first filling pattern 250 having a pillar shape may be covered by the channel 240. The first filling pattern 250 may include an oxide, e.g., silicon oxide.

The capping pattern 260 may contact upper surfaces of the first filling pattern 250, the channel 240, and the charge storage structure 230, and may include polysilicon doped with n-type impurities or p-type impurities.

The first insulating interlayer 270 may be formed on the capping pattern 260 and an uppermost one of the insulation patterns 165, and may cover an upper sidewall of the second blocking pattern 350.

The second insulating interlayer 410 may be formed on the first insulating interlayer 270, the CSL 400, the second spacer 390, and the second blocking pattern 350. The contact plug 420 may extend through the first and second insulating interlayers 270 and 410 to contact an upper surface of the capping pattern 260. The third insulating interlayer 430 may be formed on the second insulating interlayer 410 and the contact plug 420, and the bit line 440 may extend through the third insulating interlayer 430. In example embodiments, the bit line may extend in the third direction, and a plurality of bit lines 440 may be formed in the second direction.

The contact plug 420 and the bit line 440 may include a metal, e.g., copper, aluminum, tungsten, titanium, tantalum, etc., and/or a metal nitride, e.g., titanium nitride, tantalum nitride, tungsten nitride, etc., and the first to third insulating interlayers 270, 410 and 430 may include an oxide, e.g., silicon oxide.

The second blocking pattern 350 may be formed on upper and lower surfaces and a portion of a sidewall of each of the gate electrodes 382, 384 and 386, and a sidewall of each of the insulation patterns 165. The second blocking pattern 350 may contact a sidewall of the charge storage structure 230. In example embodiments, the second blocking pattern 350 may include a metal oxide, e.g., aluminum oxide, hafnium oxide, etc.

In the vertical memory device, the channel 240 may directly contact the second impurity region 320 contacting the upper surface of the first impurity region 110, and thus may be electrically connected to the CSL 400 contacting the first impurity region 110 through the second impurity region 320. As will be illustrated subsequently, the second impurity region 320 may be well connected to the channel 240 regardless of the stack number of the overlying gate electrodes, and the first and second impurity regions 110 and 320 may be doped with impurities having the same conductivity type, so that the channel 240 and the CSL 400 may be electrically connected to each other easily.

As will be illustrated subsequently, during the formation process of the first gap 310 for the second impurity region 320, the upper structures may not fall down by the support pattern 140 and the channel 240. The insulation pattern 165 under the first gate electrode 382 may be protected by the third impurity region 150, so as not to be damaged during the formation process of the first gap 310.

Figure 4:
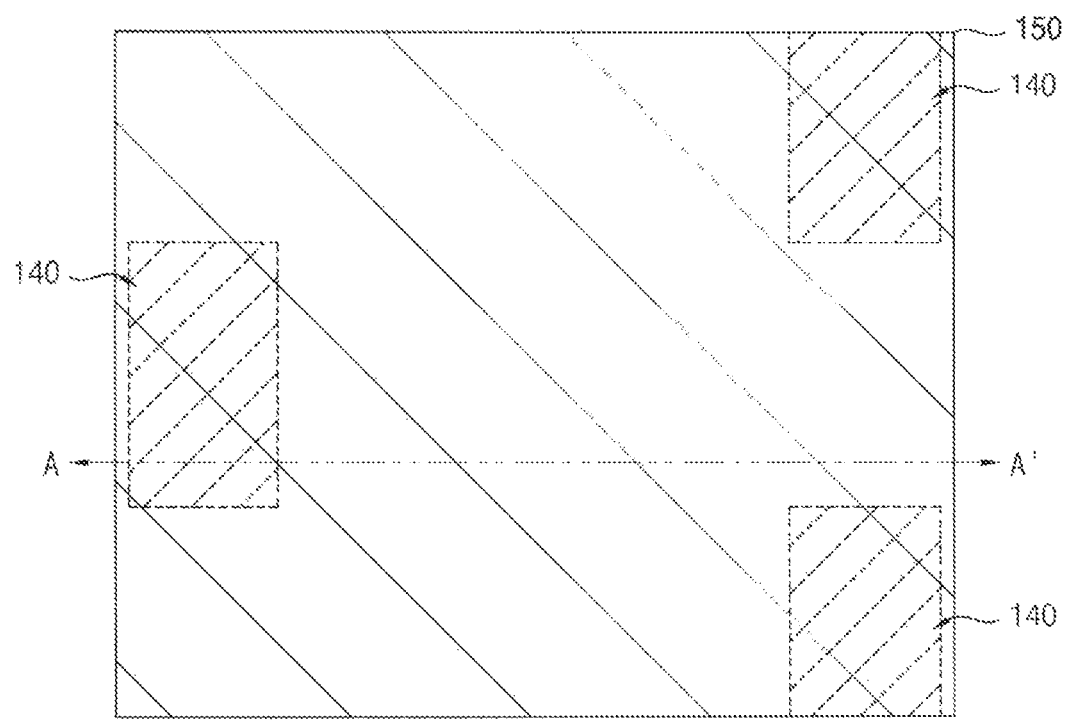
FIGS. 4 to 19 are plan views and cross-sectional views illustrating a method of manufacturing a vertical memory device in accordance with example embodiments.

FIGS. 4 to 19 are plan views and cross-sectional views illustrating a method of manufacturing a vertical memory device in accordance with example embodiments. Particularly, FIGS. 4, 7 and 10 are plan views, and FIGS. 5-6, 8-9 and 11-19 are cross-sectional views. FIG. 15 is an enlarged cross-sectional view of a region X of FIG. 14.

Figure 5:
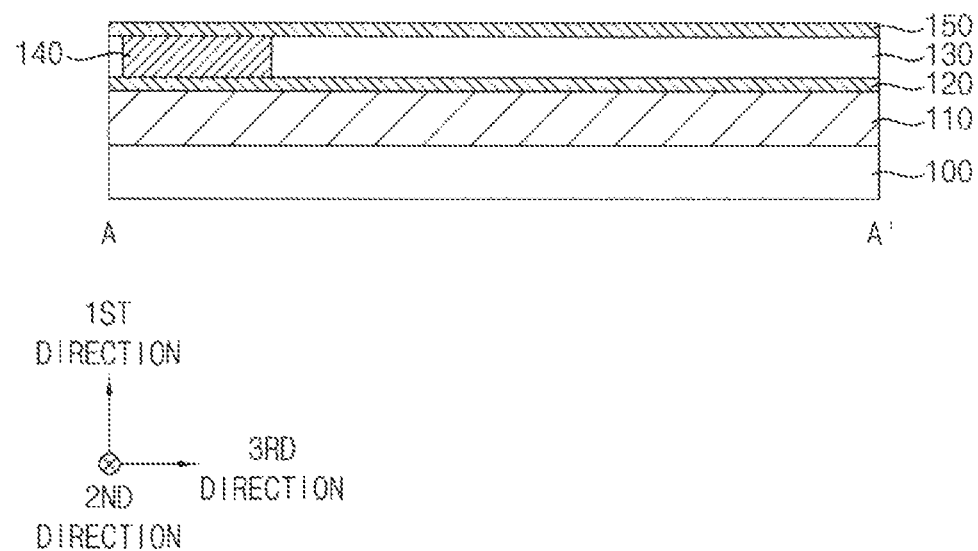

Referring to FIGS. 4 and 5, a first etch stop layer 110, a diffusion prevention layer 120 and a first sacrificial layer 130 may be sequentially formed on an upper surface of a substrate 100, a support pattern 140 may be formed on a portion of the first sacrificial layer 130, and a second etch stop layer 150 may be formed on the first sacrificial layer 130 and the support pattern 140.

In example embodiments, the first etch stop layer 110 may include a material having a high etching selectivity with respect to an oxide and a nitride included in an insulation layer 160 and a second sacrificial layer 170, respectively, subsequently formed (refer to FIG. 6).

In an example embodiment, the first etch stop layer 110 may include n-type impurities, e.g., phosphorus, arsenic, etc., and polysilicon doped with carbon. The n-type impurities may have a high doping concentration of, e.g., about $1 \times 10^{18}$ cm$^{-3}$ to about $1 \times 10^{20}$ cm$^{-3}$. Alternatively, the first etch stop layer 110 may include polysilicon doped with n-type impurities, e.g., phosphorus, arsenic, etc.

Alternatively, the first etch stop layer 110 may include p-type impurities, e.g., boron, aluminum, etc., and polysilicon doped with carbon. The p-type impurities may have a doping concentration of, e.g., about $1 \times 10^{16}$ cm$^{-3}$ to about $1 \times 10^{18}$ cm$^{-3}$. Alternatively, the first etch stop layer 110 may include polysilicon doped with p-type impurities, e.g., boron, aluminum, etc.

In example embodiments, the diffusion prevention layer 120 may prevent impurities doped in the first etch stop layer 110 from diffusing into the first sacrificial layer 130. The diffusion prevention layer 120 may include an oxide, e.g., silicon oxide or a nitride, e.g., silicon nitride.

In example embodiments, the first sacrificial layer 130 may include a material having a high etching selectivity with respect to the diffusion prevention layer 120 and the second etch stop layer 150.

In an example embodiment, the first sacrificial layer 130 may include undoped polysilicon. Alternatively, the first sacrificial layer 130 may include a nitride, e.g., silicon nitride, or an oxide, e.g., silicon oxide. In this case, the diffusion prevention layer 120 may not be formed between the first etch stop layer 110 and the first sacrificial layer 130.

In example embodiments, the support pattern 140 may be formed by doping impurities into a portion of the first sacrificial layer 130 by an ion implantation process. In an example embodiment, the support pattern 140 may include polysilicon doped with carbon. Alternatively, the support pattern 140 may include carbon, and polysilicon doped with n-type or p-type impurities.

The support pattern 140 may be formed to overlap an area of an opening 290 illustrated with reference to FIGS. 10 and 11. The opening 290 may extend in the second direction, and a plurality of openings 290 may be formed in the third direction. Thus, one or a plurality of support patterns 140 may be formed in the second direction, and a plurality of support patterns 140 may be formed in the third direction.

In example embodiments, the second etch stop layer 150 may include a material having a high etching selectivity with respect to the first sacrificial layer 130.

In an example embodiment, the second etch stop layer 150 may include polysilicon doped with carbon. Alternatively, the second etch stop layer 150 may include carbon, and polysilicon doped with n-type impurities or p-type impurities. The n-type impurities or the p-type impurities doped into the third impurity region 150 may have the same conductivity type as that of the impurities doped into the first etch stop layer 110.

Figure 6:
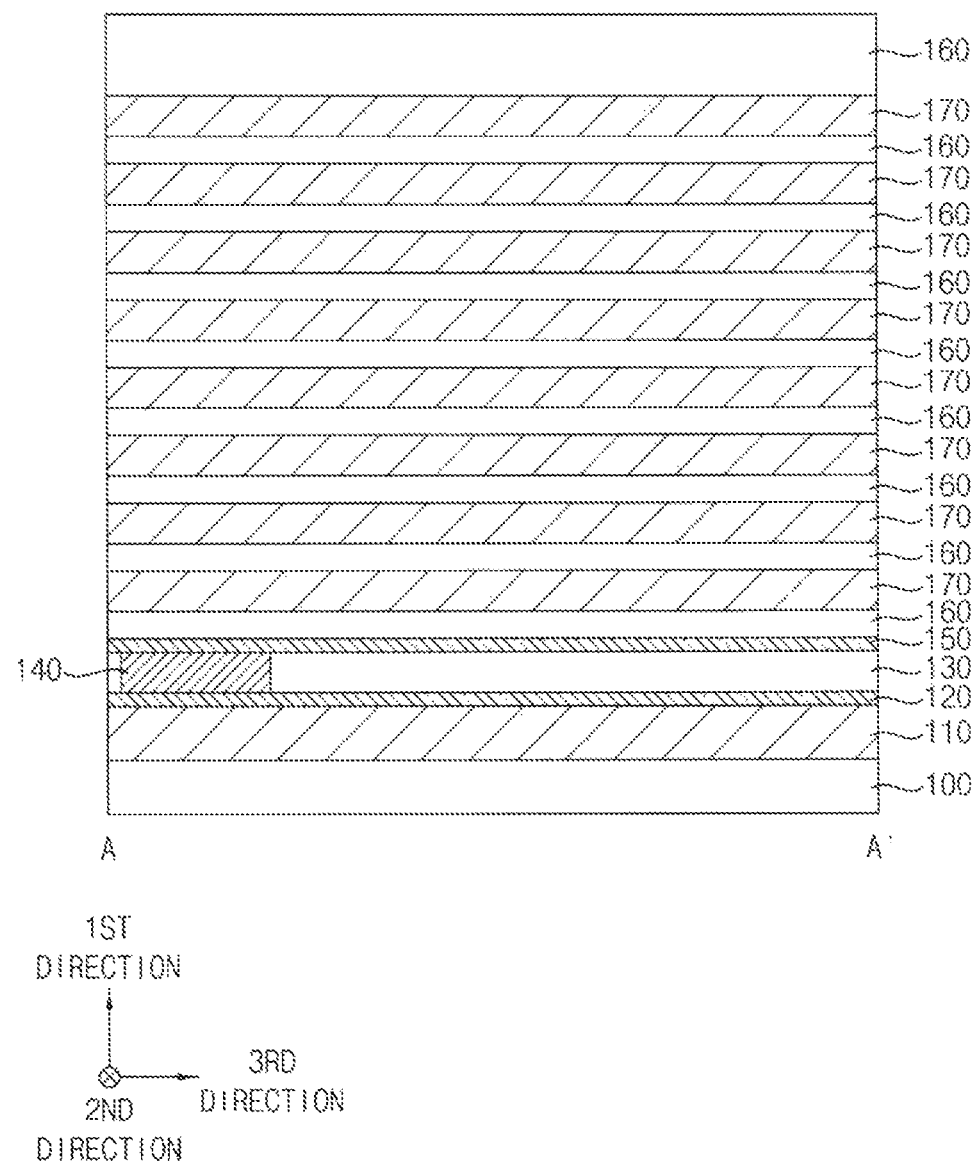
Figure 7:
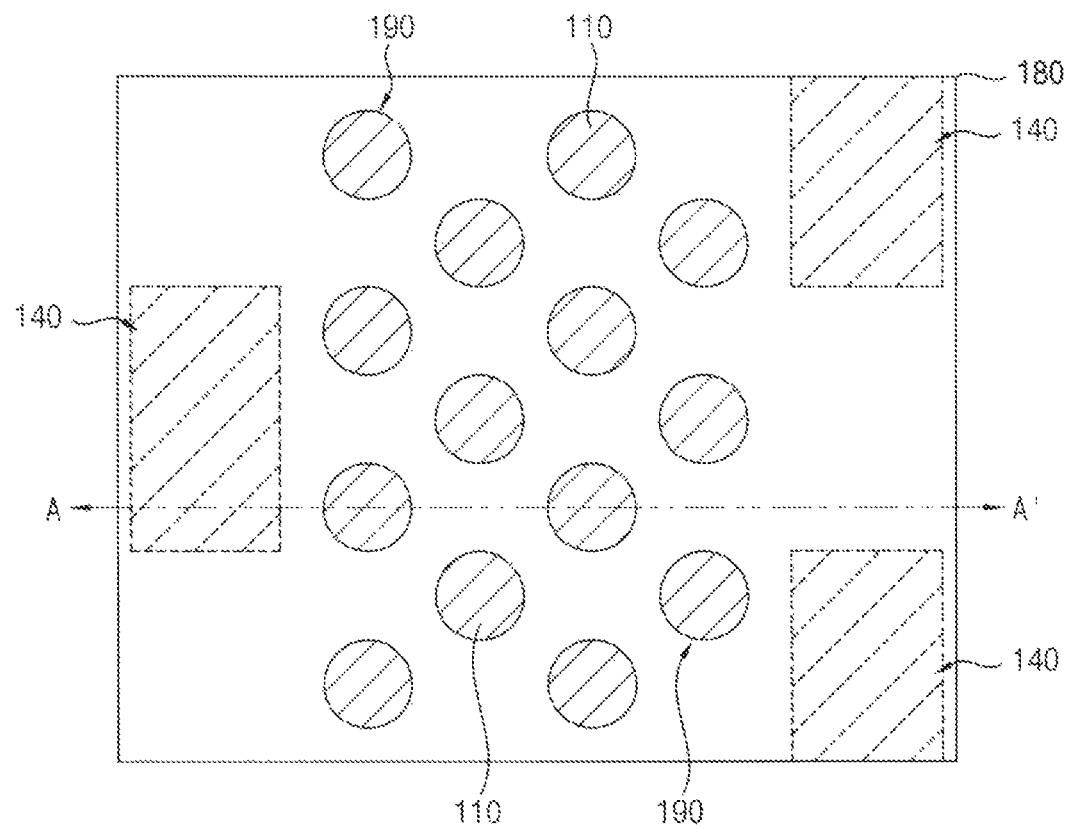

Referring to FIG. 6, an insulation layer 160 and a second sacrificial layer 170 may be alternately and repeatedly formed on the second etch stop layer 150, so that a mold may be formed.

In example embodiments, the insulation layer 160 may include an oxide, e.g., silicon oxide, and the second sacrificial layer 170 may include a material having a high etching selectivity with respect to the insulation layer 160, e.g., a nitride such as silicon nitride.

The insulation layer 160 and the second sacrificial layer 170 may be formed by a chemical vapor deposition (CVD) process, a plasma enhanced chemical vapor deposition (PECVD) process, an atomic layer deposition (ALD) process, etc.

Figure 8:
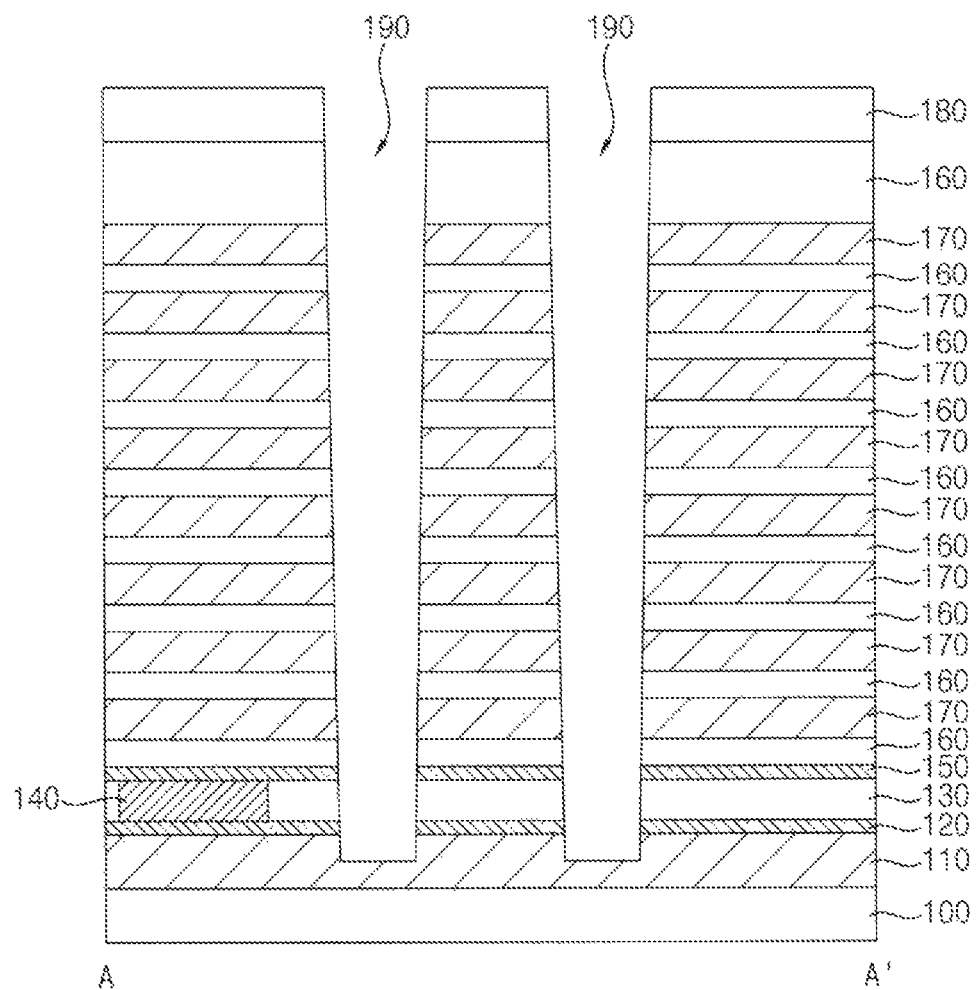
Figure 8:
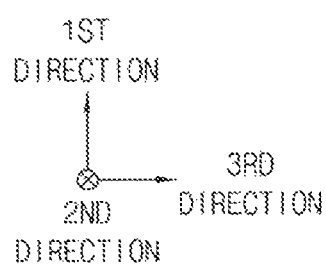

Referring to FIGS. 7 and 8, a first etching mask 180 may be formed on an uppermost one of the insulation layers 160, and a channel hole 190 may be formed through the mold, the second etch stop layer 150 and the first sacrificial layer 130 by a dry etching process using the first etching mask 180.

The first etching mask 180 may include a nitride, e.g., silicon nitride.

In example embodiments, the dry etching process may be performed until the channel hole 190 may expose an upper surface of the first etch stop layer 110. Further, the channel hole 190 may extend through an upper portion of the first etch stop layer 110, which is shown in FIG. 8.

A plurality of channel holes 190 may be formed in each of the second and third directions, and thus a channel hole array including a plurality of channel hole columns may be defined.

Figure 9:
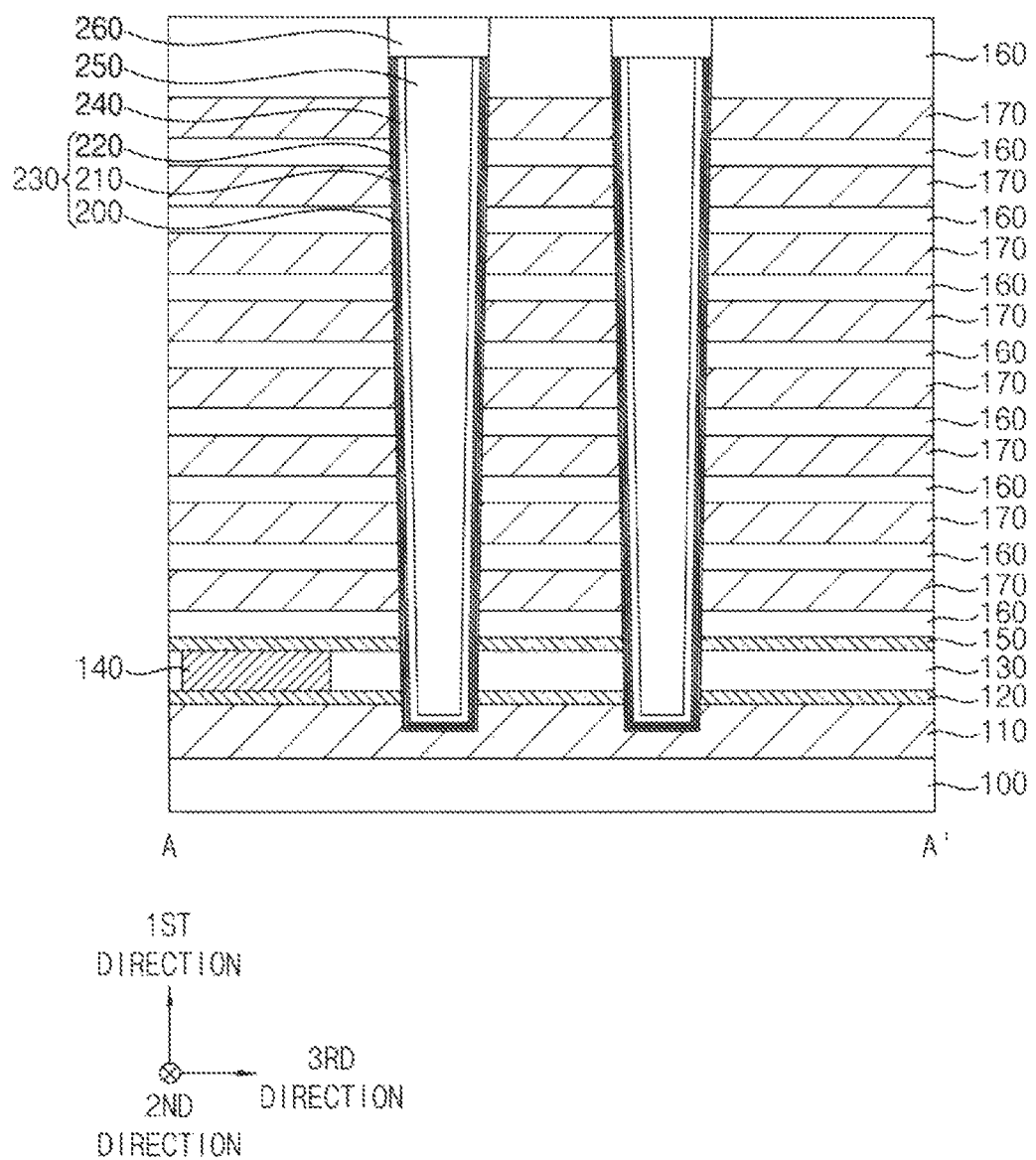
Figure 10:
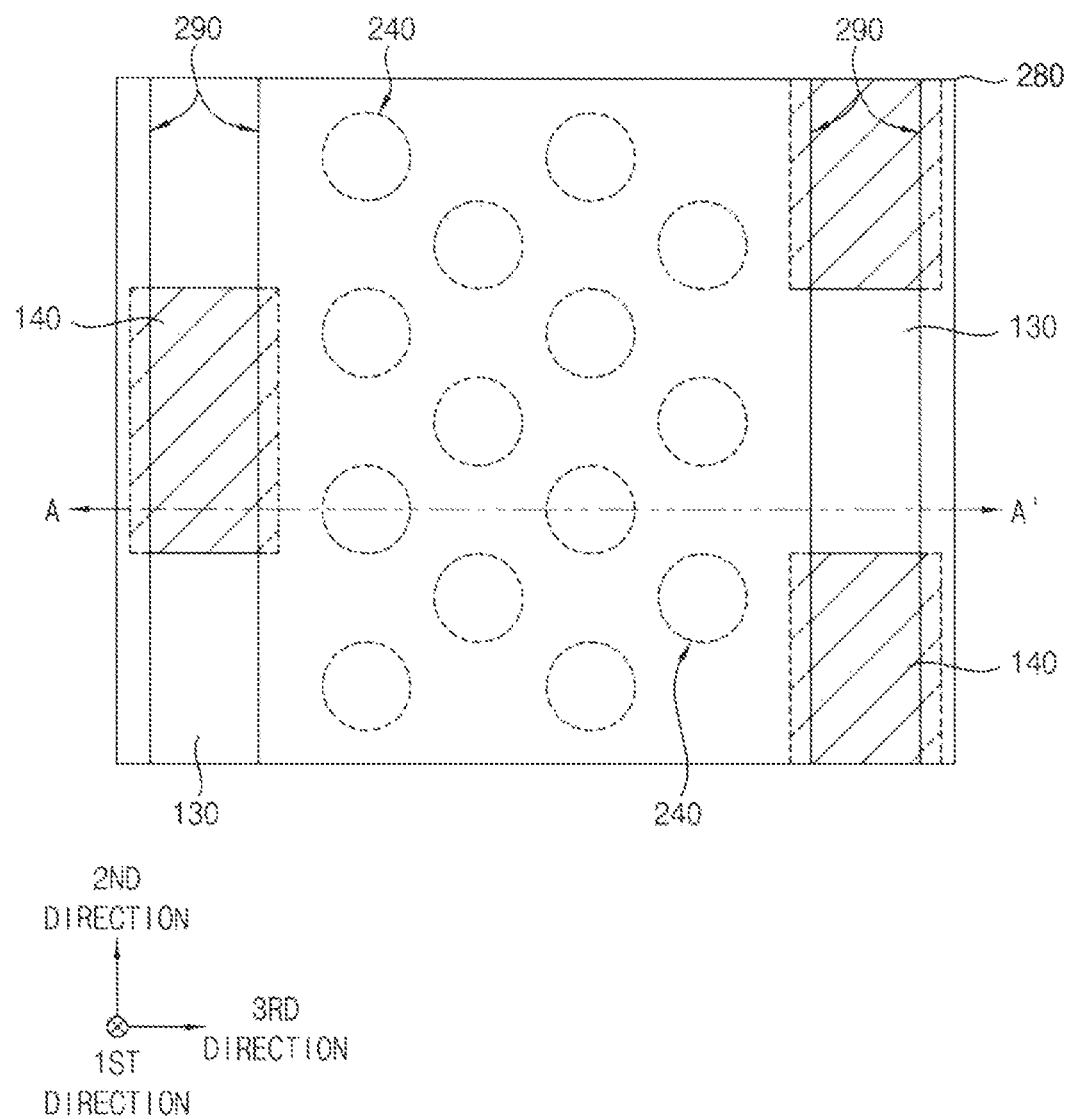

Referring to FIG. 9, a charge storage structure 230, a channel 240, a first filling pattern 250, and a capping pattern 260 may be formed in the channel hole 190.

For example, a charge storage structure layer and a channel layer may be sequentially formed on a sidewall of the channel hole 190, the upper surface of the first etch stop layer 110 exposed by the channel hole 190, and an upper surface of the first etching mask 180, a first filling layer may be formed on the channel layer to fill the channel hole 190, and the first filling layer, the channel layer, and the charge storage structure layer may be planarized until the uppermost one of the insulation layers 160 may be exposed.

In example embodiments, the planarization process may include a chemical mechanical polishing (CMP) process and/or an etch back process, and he first etching mask 180 may be removed during the planarization process.

By the planarization process, the charge storage structure 230 and the channel 240 sequentially stacked on the sidewall of the channel hole 190 and the upper surface of the first etch stop layer 110 may be formed, and an inner space formed by the channel 240 may be filled with the first filling pattern 250.

As the channel hole 190 defines the channel hole columns and the channel array, the channel 240 in the channel hole 190 may define channel columns and a channel array.

In example embodiments, the charge storage structure 230 may include a first blocking pattern 200, a charge storage pattern 210, and a tunnel insulation pattern 220 sequentially stacked. For example, the first blocking pattern 200, the charge storage pattern 210, and the tunnel insulation pattern 220 may include silicon oxide, silicon nitride, and silicon oxide, respectively.

In example embodiments, when the charge storage structure 230, the channel 240, the first filling pattern 250, and the capping pattern 260 are formed in the channel hole 190, a heat treatment process may be performed. The diffusion prevention layer 120 may be formed on the first etch stop layer 110, and thus the impurities doped in the first etch stop layer 110 may not be diffused into the first sacrificial layer 130 or the support pattern 140.

Accordingly, when the first sacrificial layer 130 is removed illustrated with reference to FIG. 13, the etching selectivity between the first sacrificial layer 130 and a surrounding structure, e.g., the diffusion prevention layer 120, the second etch stop layer 150, and the support pattern 140, or the etching selectivity between the first sacrificial layer 130 and the underlying first etch stop layer 110 may not be lowered.

Upper portions of the first filling pattern 250, the channel 240, and the charge storage stru230 may be removed to form a recess, a capping layer may be formed on the uppermost one of the insulation layers 160 to fill the recess, and the capping layer may be planarized until the upper surface of the uppermost one of the insulation layers 160 may be exposed.

Figure 11:
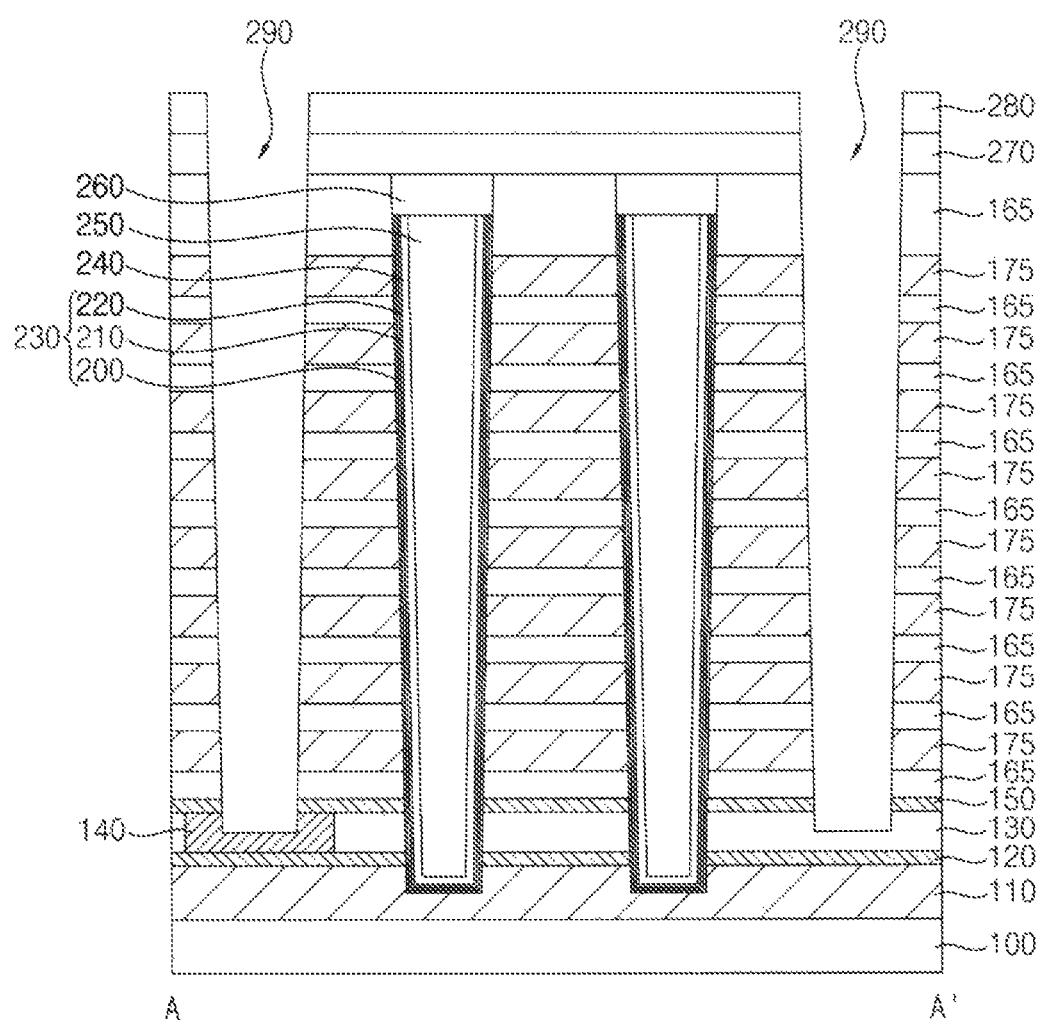
Figure 11:
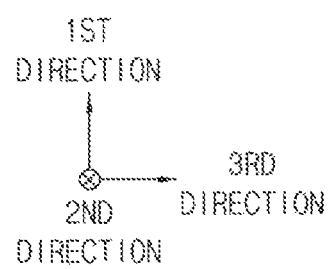

Referring to FIGS. 10 and 11, a first insulating interlayer 270 may be formed on the uppermost one of the insulation layers 160 and the capping pattern 260, and a second etching mask 280 may be formed on the first insulating interlayer 270.

The first insulating interlayer 270 may include an oxide, e.g., silicon oxide, and thus may be merged with the uppermost one of the insulation layers 160. The second etching mask 280 may include a nitride, e.g., silicon nitride.

The first insulating interlayer 270, the mold, and the second etch stop layer 150 may be etched by a dry etching process using the second etching mask 280 to form the opening 290.

In example embodiments, the dry etching process may be performed until the opening 290 may expose an upper surface of the first sacrificial layer 130, and an upper surface of the support pattern 140 may be also exposed. Further, the opening 290 may extend through an upper portion of the first sacrificial layer 130 and an upper portion of the support pattern 140, which is shown in FIG. 11.

In example embodiments, the opening 290 may extend in the second direction, and a plurality of openings 290 may be formed in the third direction. As the opening 290 is formed, the insulation layer 160 may be transformed into an insulation pattern 165 extending in the second direction, and the second sacrificial layer 170 may be transformed into a second sacrificial pattern 175.

Figure 12:
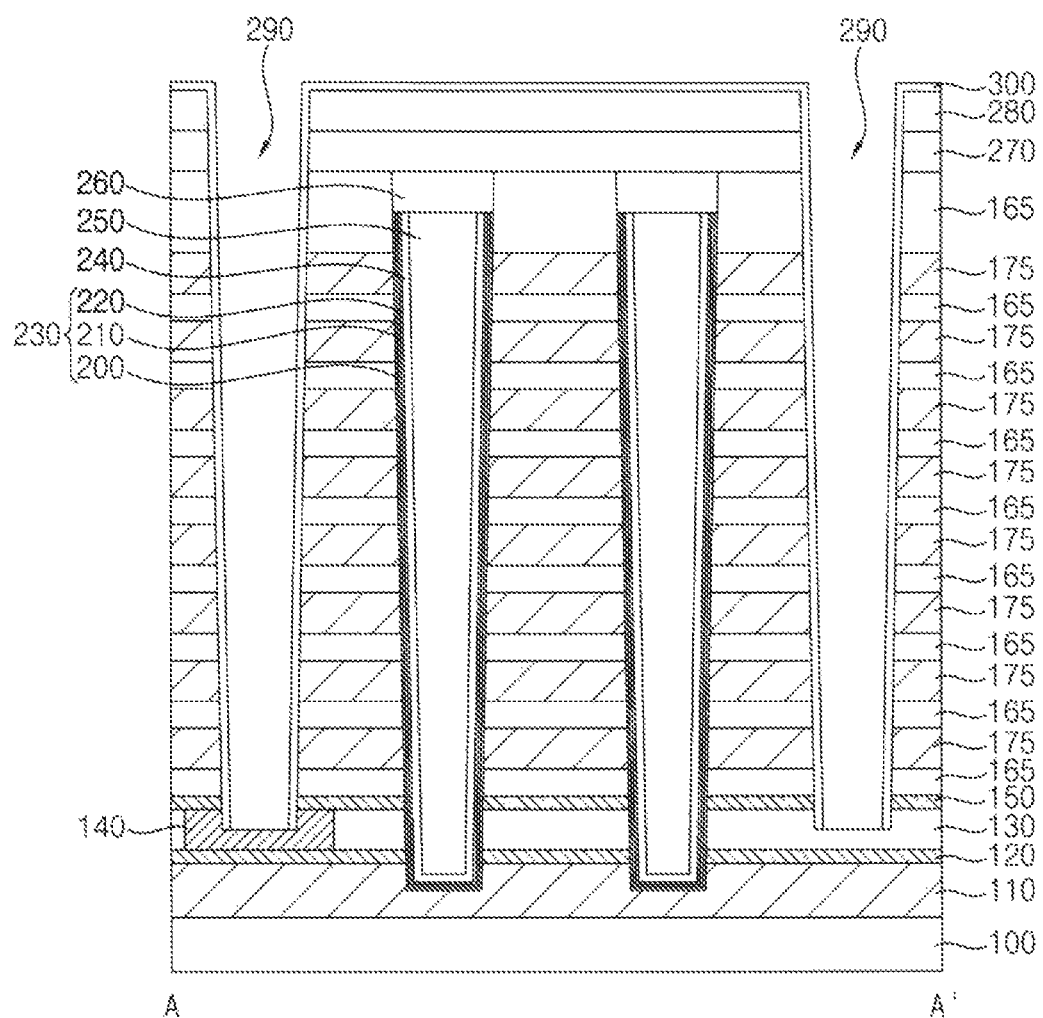

Referring to FIG. 12, a first spacer 300 may be formed on a sidewall of the opening 290.

The first spacer 300 may be formed by forming a first spacer layer on the sidewall of the opening 290, the upper surfaces of the first sacrificial layer 130 and the support pattern 140 exposed by the opening 290, and the second etching mask 280, and anisotropically etching the first spacer layer. Thus, the first spacer 300 may be formed on the sidewall of the opening 290, and the upper surfaces of the first sacrificial layer 130 and the support pattern 140 may be exposed. A portion of the first spacer layer on the second etching mask 280 may remain.

The first spacer 300 may include a material having a high etching selectivity with respect to the first sacrificial layer 130. Thus, when the first sacrificial layer 130 includes undoped polysilicon, the first spacer 300 may include a nitride, e.g., silicon nitride. Alternatively, when the first sacrificial layer 130 includes silicon nitride or silicon oxide, the first spacer 300 may include, e.g., undoped polysilicon.

Figure 13:
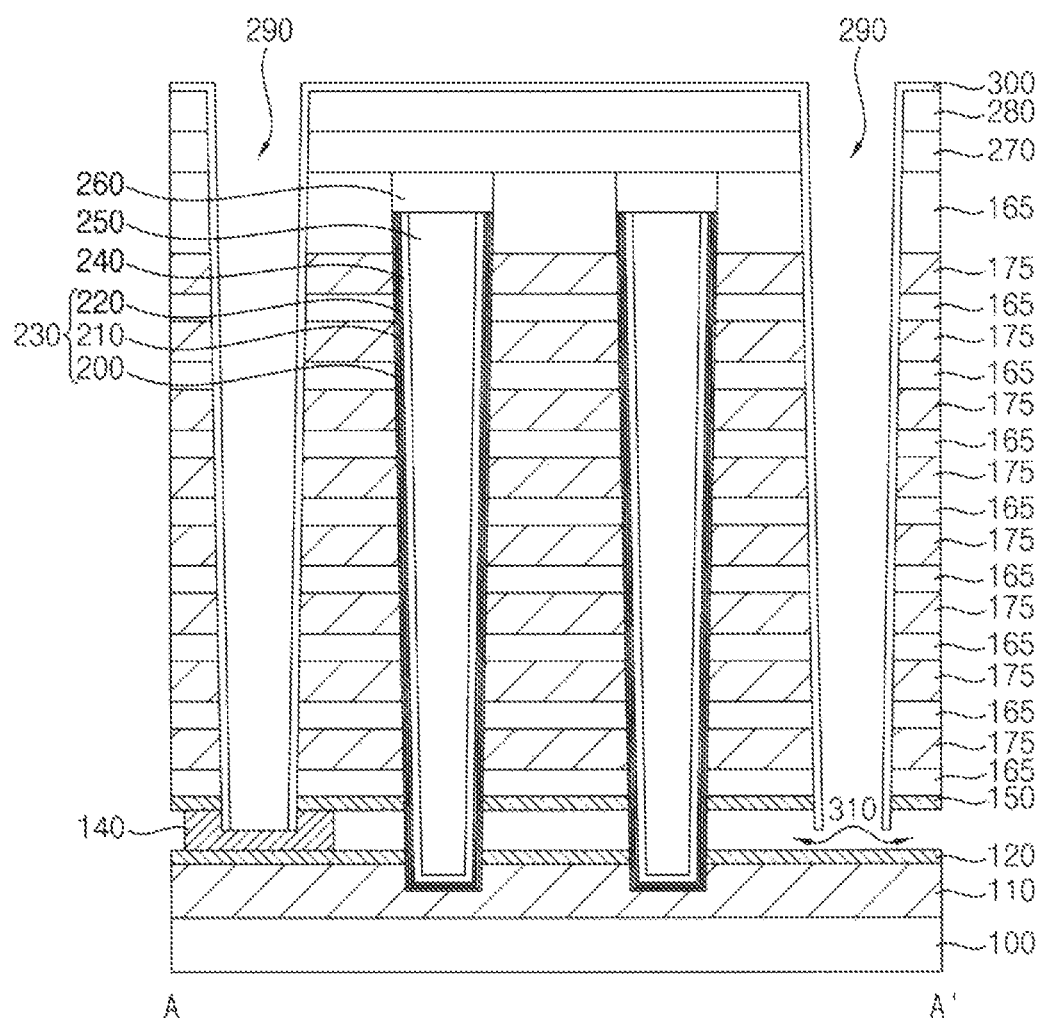

Referring to FIG. 13, the first sacrificial layer 130 exposed by the opening 290 may be removed to form a first gap 310.

Thus, an upper surface of the diffusion prevention layer 120 under the first sacrificial layer 130, a lower surface of the second etch stop layer 150 on the first sacrificial layer 130, and a sidewall of the support pattern 140 generated from the first sacrificial layer 130 may be exposed. A portion of the sidewall of the charge storage structure 230 may be also exposed by the first gap 310.

In example embodiments, the first sacrificial layer 130 may be removed by a wet etching process. During the wet etching process, the diffusion prevention layer 120 and the second etch stop layer 150 are formed beneath and on the first sacrificial layer 130, respectively, which may not be removed due to the materials having the high selectivity with respect to the first sacrificial layer 130.

For example, when the first sacrificial layer 130 includes undoped polysilicon, the diffusion prevention layer 120 may include silicon oxide or silicon nitride, and the second etch stop layer 150 may include polysilicon doped with carbon, or carbon and polysilicon doped with n-type or p-type impurities. Thus, the first etch stop layer 110 beneath the diffusion prevention layer 120 and the insulation pattern 165 on the second etch stop layer 150 may not be damaged.

When no diffusion prevention layer 120 is formed, the first etch stop layer 110 under the first sacrificial layer 130 may include a material having a high etching selectivity with respect to the first sacrificial layer 130, and thus may not be damaged during the wet etching process. For example, when the first sacrificial layer 130 includes silicon nitride or silicon oxide, the first etch stop layer 110 may include polysilicon doped with n-type or p-type impurities, and thus may not be damaged during the wet etching process for the first sacrificial layer 130.

Additionally, the first spacer 300 covering the sidewall of the opening 290 may include a material having a high etching selectivity with respect to the first sacrificial layer 130, and thus may not be damaged during the wet etching process.

In example embodiments, even if the first gap 310 is formed by the wet etching process, the mold may not fall down due to the channel 240 extending through the insulation patterns 165 and the second sacrificial patterns 175, and the support pattern 140 under the mold.

Figure 14:
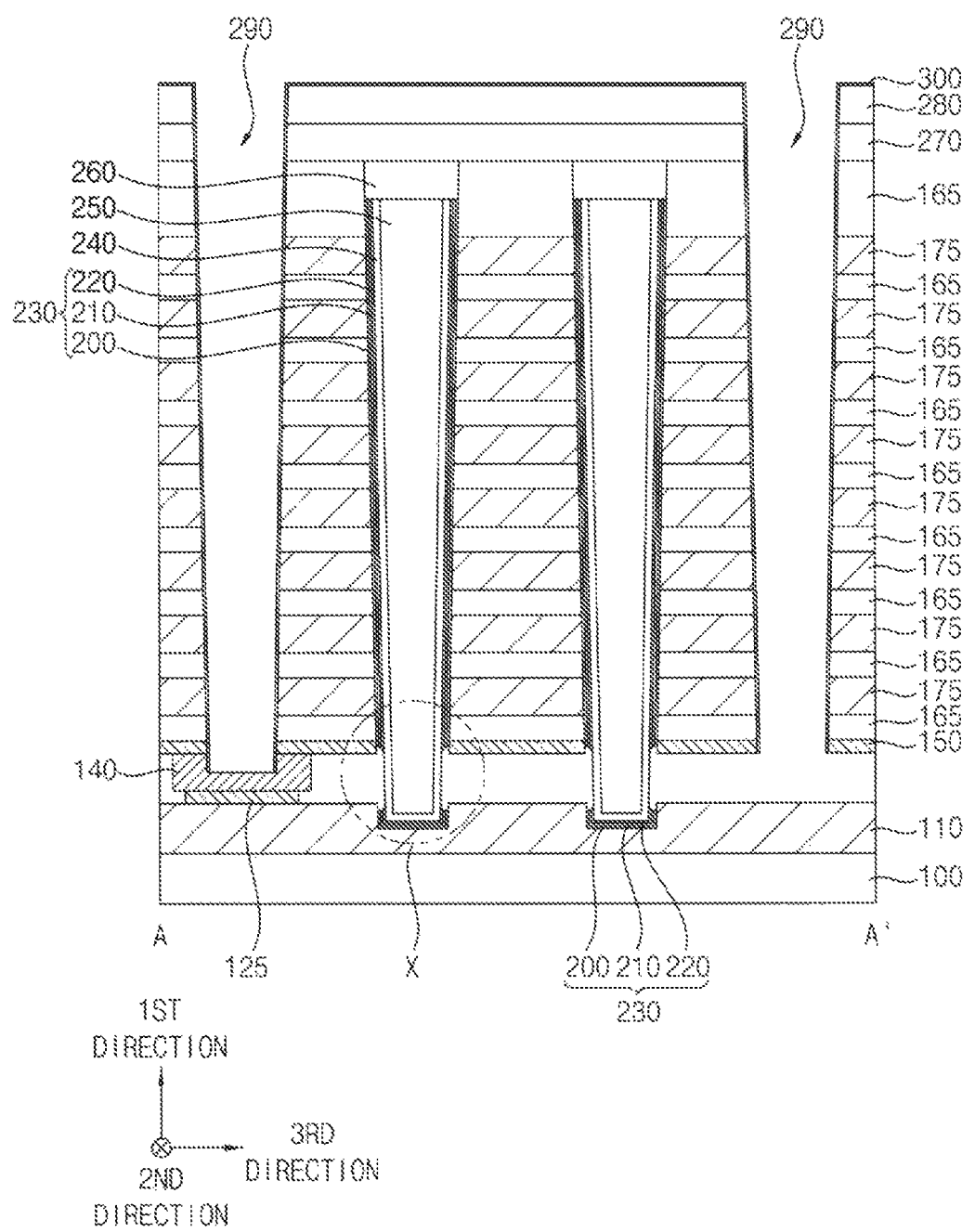
Figure 15:
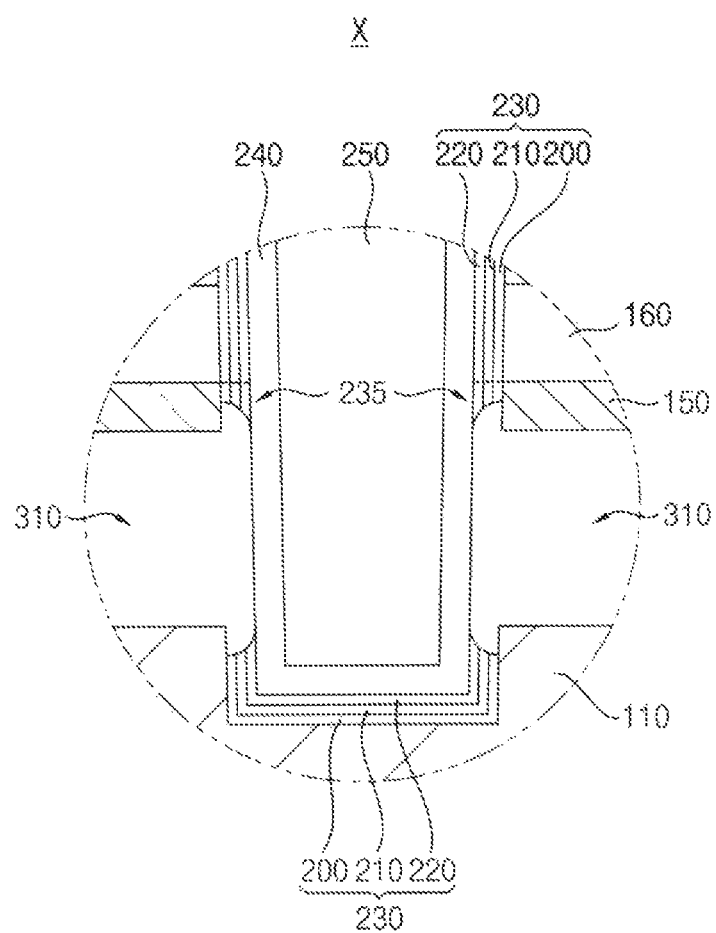

Referring to FIGS. 14 and 15, a portion of the charge storage structure 230 exposed by the first gap 310 may be removed, and thus an outer sidewall of the channel 240 covered by the charge storage structure 230 may be exposed.

In example embodiments, the exposed portion of the charge storage structure 230 may be removed by a wet etching process. The first blocking pattern 200, the charge storage pattern 210, and the tunnel insulation pattern 220 of the charge storage structure 230 may include, e.g., silicon oxide, silicon nitride, silicon oxide, respectively, and the first spacer 300 covering the sidewall of the opening 290 may include, e.g., silicon nitride, and thus the first spacer 300 may be partially removed to have a thinner thickness.

However, in the wet etching process, the first spacer 300 may not completely removed but some portion thereof may remain, and thus the insulation patterns 165 and the second sacrificial patterns 175 covered by the first spacer 300 may not etched.

During the wet etching process, most of the diffusion prevention layer 120 including silicon oxide or silicon nitride may be removed. That is, a portion of the diffusion prevention layer 120 exposed by the first gap 310 and a portion of the diffusion prevention layer 120 covering an edge lower surface of the support pattern 140 in the third direction may be removed. However, a portion of the diffusion prevention layer 120 covering a central lower surface of the support pattern 140 may remain, which may be referred to as a diffusion prevention pattern 125.

The wet etching process may have isotropic etching characteristics, and thus not only the portion of the charge storage structure 230 directly exposed by the first gap 310 but also a portion of the charge storage structure 230 contacting a sidewall of the second etch stop layer 150 facing the outer sidewall of the channel 240 may be partially removed. However, a portion of the charge storage structure 230 contacting an upper sidewall of the second etch stop layer 150 and a portion of the charge storage structure 230 contacting the outer sidewall of the channel 240 adjacent the sidewall of the second etch stop layer 150 may remain to form a protrusion 235.

In example embodiments, the second etch stop layer 150 may have a thin thickness of about 5 nm to about 50 nm. Thus, the protrusion 235 of the charge storage structure 230 may have a small length in the first direction.

By the wet etching process, a portion of the charge storage structure 230 extending through an upper portion of the first etch stop layer 110 may remain, which may be divided from other portions of the charge storage structure 230.

Figure 16:
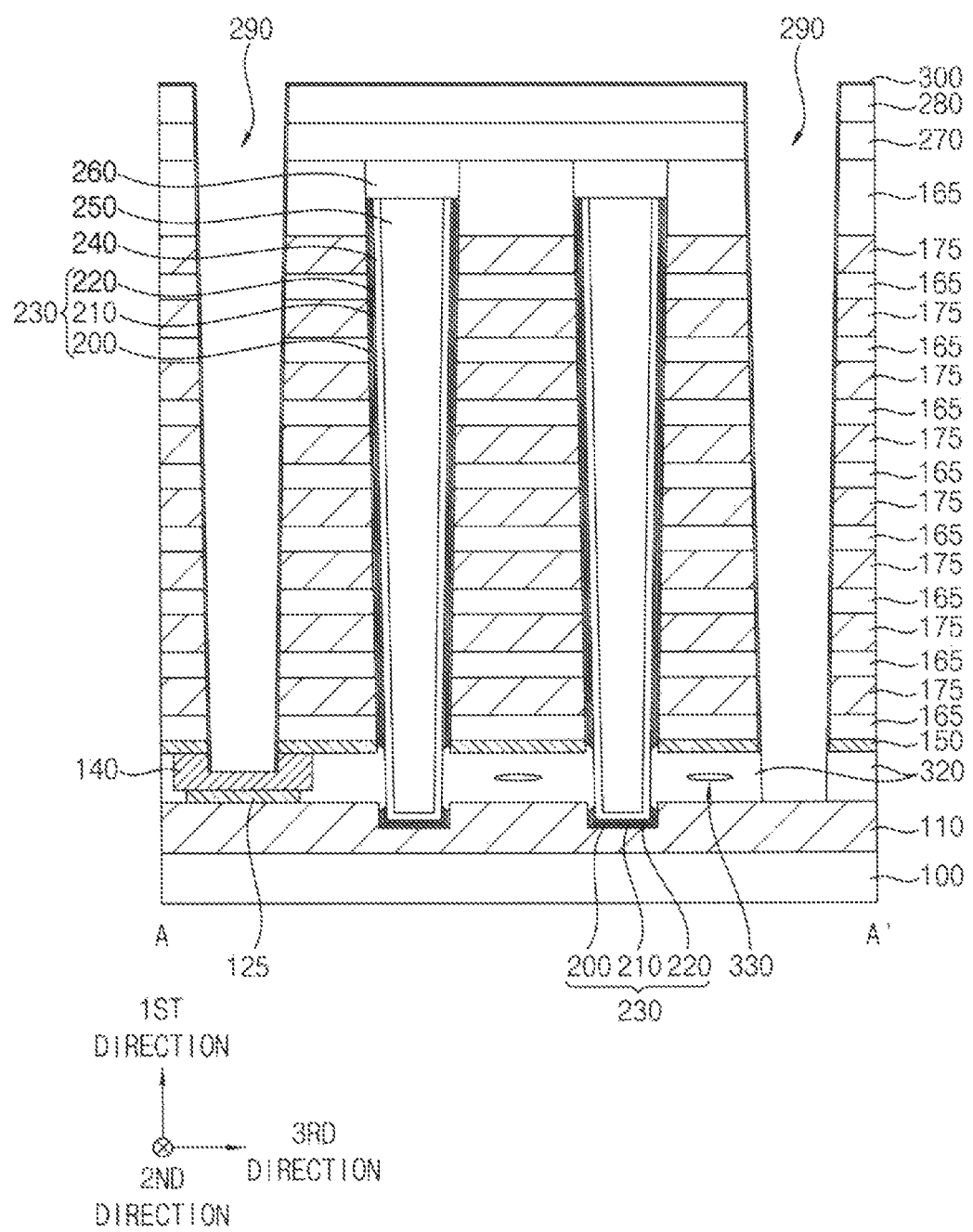

Referring to FIG. 16, a second filling pattern 320 may be formed to fill the first gap 310.

In example embodiments, the second filling pattern 320 may be formed by forming a second filling layer on the first etch stop layer 110 to fill the first gap 310, and performing an etch back process to remove a portion of the second filling layer in the opening 290. When the second filling pattern 320 does not fill the first gap 310 completely, an air gap 330 may be formed in the first gap 310.

The second filling pattern 320 may include polysilicon doped with impurities having the same conductivity type as that of the impurities doped into the first etch stop layer 110. That is, when the first etch stop layer 110 includes n-type impurities, the second filling pattern 320 may include polysilicon doped with n-type impurities, and the n-type impurities may have a high doping concentration of, e.g., about $1 \times 10^{18}$ cm$^{-3}$ to about $1 \times 10^{20}$ cm$^{-3}$. When the first etch stop layer 110 includes p-type impurities, the second filling pattern 320 may include polysilicon doped with p-type impurities, and the p-type impurities may have a doping concentration of, e.g., about $1 \times 10^{16}$ cm$^{-3}$ to about $1 \times 10^{18}$ cm$^{-3}$.

After forming the second filling layer, a heat treatment process may be further performed, and the impurities doped in the second filling pattern 320 may be diffused into the second etch stop layer 150. Thus, when the second etch stop layer 150 includes polysilicon doped with carbon, n-type or p-type impurities may be further doped into the second etch stop layer 150 by the heat treatment process.

The first etch stop layer 110, the second filling pattern 320, and the second etch stop layer 150 sequentially stacked on the substrate 100 may include impurities having the same conductivity type, and thus may be referred to as first, second, and third impurity regions, respectively. The first to third impurity regions may define an impurity region structure.

Figure 17:
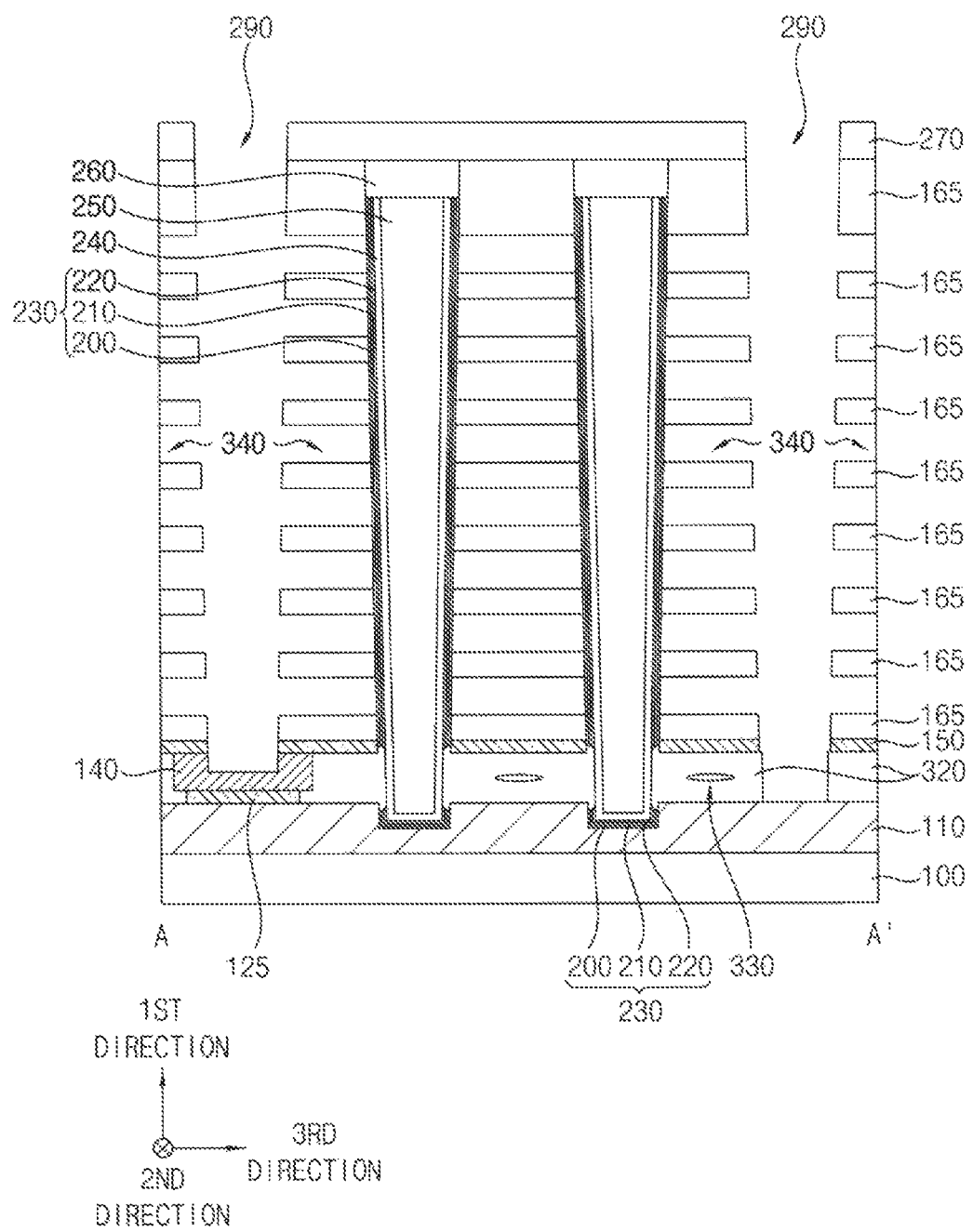

Referring to FIG. 17, the first spacer 300 on a sidewall of the opening 290, the second etching mask 280, and the second sacrificial patterns 175 may be removed to form a second gap 340 between the insulation patterns 165 at respective levels. A portion of an outer sidewall of the first blocking pattern 200 may be exposed by the second gap 340.

In example embodiments, the first spacer 300 and the second sacrificial patterns 175 may be removed by a wet etching process using an etching solution including phosphoric acid or sulfuric acid.

Figure 18:
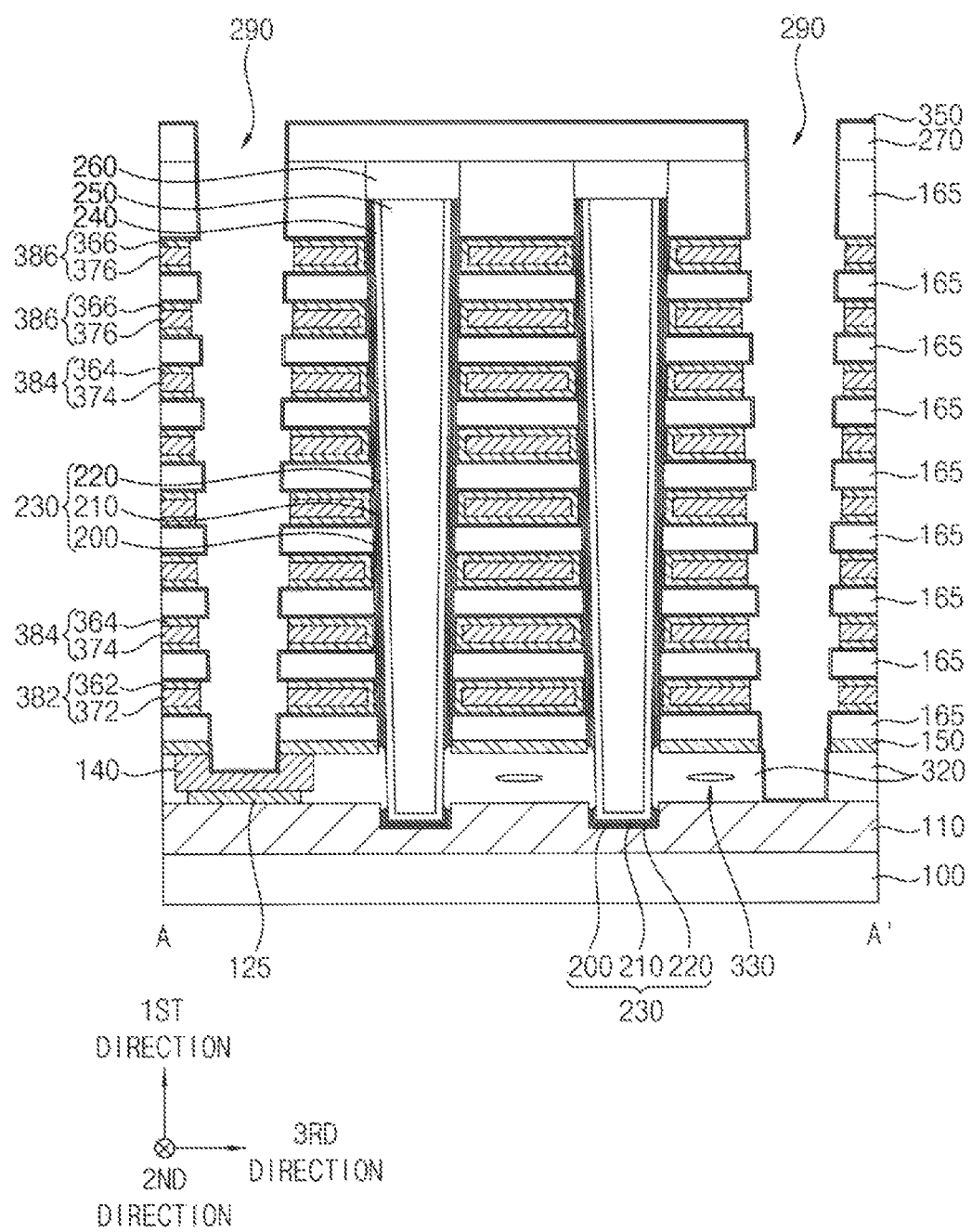

Referring to FIG. 18, after a second blocking pattern 350 may be formed on the exposed portion of the sidewall of the first blocking pattern 200, inner walls of the second gaps 340, surfaces of the insulation patterns 165, an upper surface of the first etch stop layer 110, an upper surface of the support pattern 140, and an upper surface of the first insulating interlayer 270, a gate barrier layer may be formed on the second blocking pattern 350, and a gate conductive layer may be formed on the gate barrier layer to fill remaining portions of the second gaps 340.

The gate conductive layer and the gate barrier layer may be partially removed to form a gate conductive pattern and a gate barrier pattern, respectively, in each of the second gaps 340, which may form a gate electrode. In example embodiments, the gate conductive layer and the gate barrier layer may be removed by a wet etching process, and thus the gate electrode may fill the second gaps 340 partially or entirely.

The gate electrode may extend in the second direction, and a plurality of gate electrodes may be formed in the third direction. Thus, the gate electrodes each extending in the second direction may be spaced apart from each other by the opening 290.

In example embodiments, the gate electrodes may be formed at a plurality of levels, respectively, spaced apart from each other in the first direction, and may form a gate electrode structure. The gate electrode structure may include at least one first gate electrode 382, a plurality of second gate electrodes 384, and at least one third gate electrode 386 sequentially stacked. The number of levels at which each of the first to third gate electrodes 382, 384 and 386 are formed may be variable.

Figure 19:
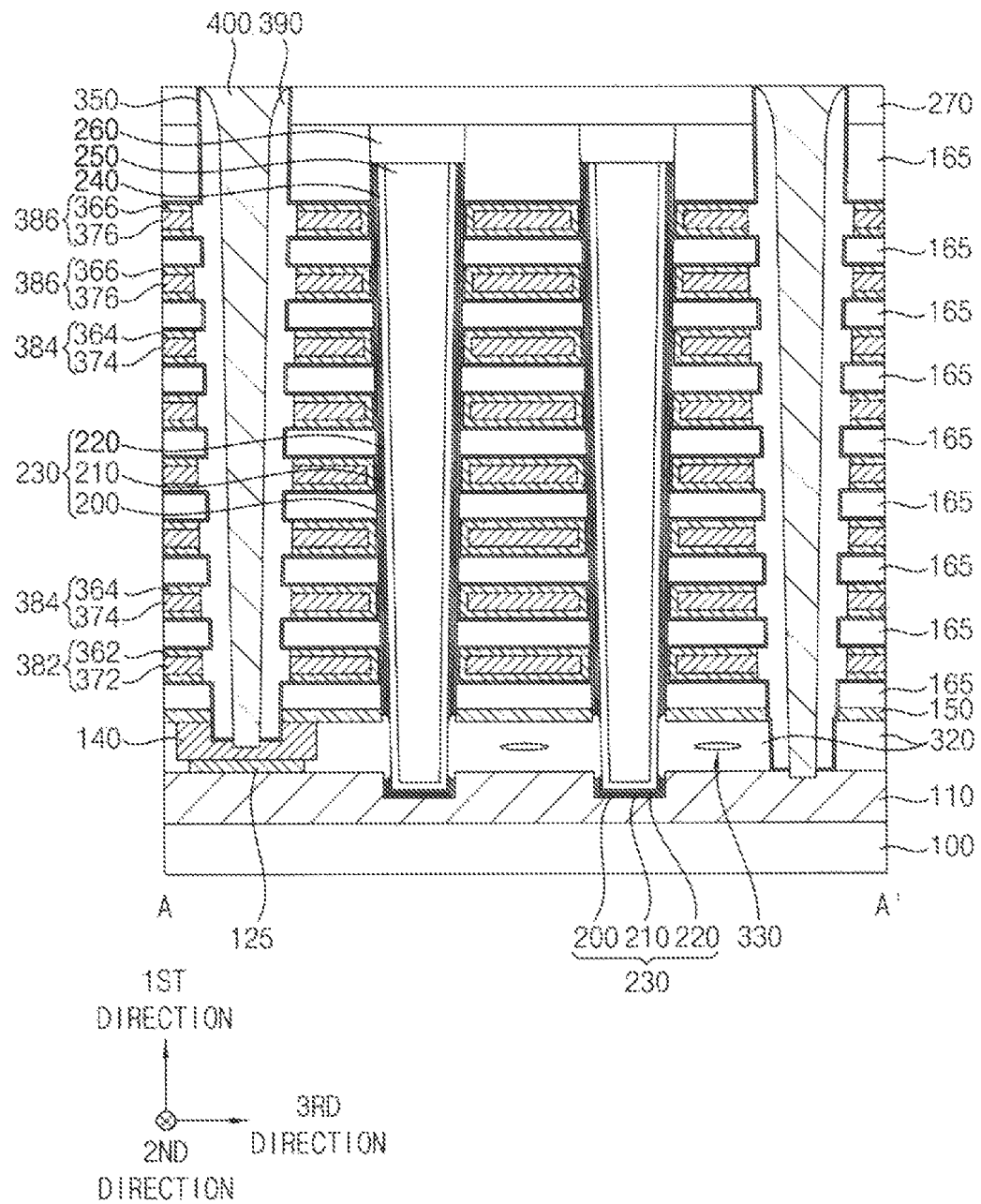

Referring to FIG. 19, when the first etch stop layer 110 includes carbon and polysilicon doped with p-type impurities or includes polysilicon doped with p-type impurities, n-type impurities may be implanted into an upper portion of the first etch stop layer 110 through a portion of the second blocking pattern 350 exposed as the gate conductive layer and the gate barrier layer are partially removed, so that an impurity region (not shown) may be formed. However, when the first etch stop layer 110 includes carbon and polysilicon doped with n-type impurities, or includes polysilicon doped with n-type impurities, the impurity region may not be formed.

A second spacer layer may be formed on the second blocking pattern 350, and may be anisotropically etched to form a second spacer 390 on the sidewall of the opening 290, and thus a portion of the second blocking pattern 350 on the first etch stop layer 110 may be exposed.

The second blocking pattern 350 may be etched using the second spacer 390 as an etching mask, and a portion of the second blocking pattern 350 on the first insulating interlayer 270 may be also removed. Upper portions of the first etch stop layer 110 and the support pattern 140 may be also partially removed.

A conductive layer may be formed on the upper surface of the first etch stop layer 110, the upper surface of the support pattern 140, the second spacer 390, and the first insulating interlayer 270, and may be planarized until the upper surface of the first insulating interlayer 270 may be exposed to form a CSL 400. The CSL may include a metal, e.g., tungsten.

In example embodiments, the CSL 400 may extend in the first direction, and extend in the second direction as well. A lower surface of the CSL 400 may be covered by the first etch stop layer 110 and the support pattern 140.

Referring to FIGS. 1 to 3 again, a second insulating interlayer 410 may be formed on the first insulating interlayer 270, the CSL 400, the second spacer 390, and the second blocking pattern 350, and a contact plug 420 may be formed through the first and second insulating interlayers 270 and 410 to contact an upper surface of the capping pattern 260. A third insulating interlayer 430 may be formed on the second insulating interlayer 410 and the contact plug 420, and a bit line 440 may be formed through the third insulating interlayer 430 to contact an upper surface of the contact plug 420.

The vertical memory device may be manufactured by the above processes.

As illustrated above, the first sacrificial layer 130 may be formed on the substrate 100, a wet etching process may be performed through the opening 290 for forming the gate electrode and the CSL 400 to remove the first sacrificial layer 130 and form the first gap 310, and the portion of the charge storage structure 230 covered by the first sacrificial layer 130 may be removed. The first gap 310 may be filled with the second filling pattern 320 so that the channel 240 and the CSL 400 may be electrically connected with each other.

Thus, even if the stack number of the second sacrificial layer 170 increases so that the channel hole 190 may be bent, the channel 240 and the CSL 400 may be well connected with each other.

The first and second etch stop layers 110 and 150 including materials having a high etching selectivity with respect to the first sacrificial layer 130 may be formed under and on the first sacrificial layer 130, respectively, and thus the insulation pattern 165 and the upper portion of the substrate 100 may not be damaged when the first sacrificial layer 130 is removed.

Additionally, even if the first gap 310 is formed by removing the insulation patterns 165 and the first sacrificial layer 130 under the second sacrificial patterns 175, the mold may be supported by the support pattern 140 and the channel 240 so as not to fall down.

Figure 20:
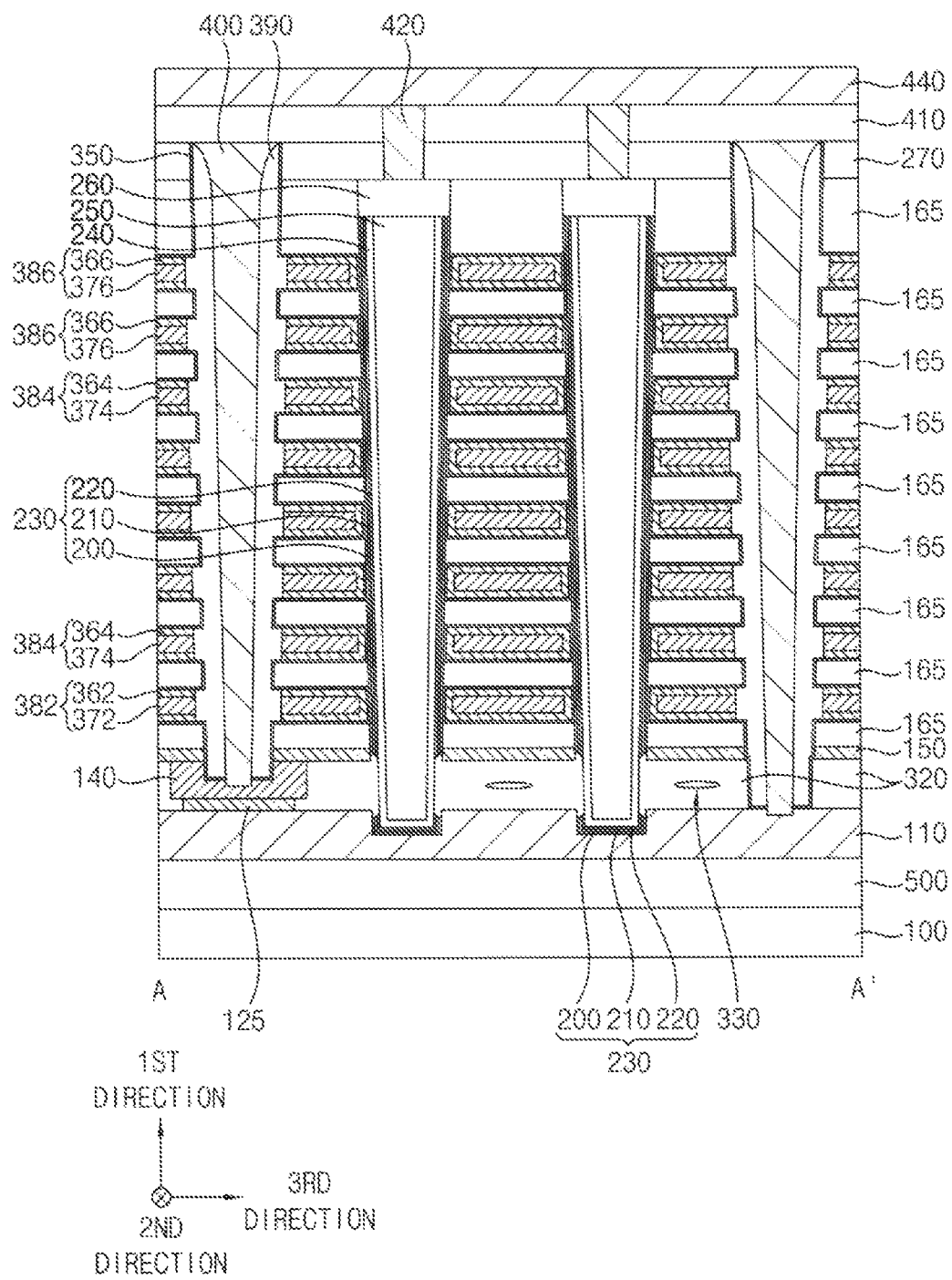
FIG. 20 is a cross-sectional view illustrating a vertical memory device in accordance with example embodiments.

FIG. 20 is a cross-sectional view illustrating a vertical memory device in accordance with example embodiments. FIG. 20 is a cross-sectional view taken along a line A-A' of FIG. 1.

This vertical memory device may be substantially the same as that of FIGS. 1 to 3, except for a lower insulating interlayer. Thus, like reference numerals refer to like elements, and detailed descriptions thereon are omitted herein.

Referring to FIG. 20, the vertical memory device may further include a lower insulating interlayer 500 between the substrate 100 and the first etch stop layer 110.

In example embodiments, the vertical memory device may have a cell over peri (COP) structure. Thus, circuit patterns (not shown) driving memory cells may be formed under the memory cells.

The circuit patterns may include transistors, contact plugs, wirings, vias, etc. The circuit patterns may be covered by the lower insulating interlayer 500, and may be electrically connected to the first etch stop layer 110.

Figure 21:
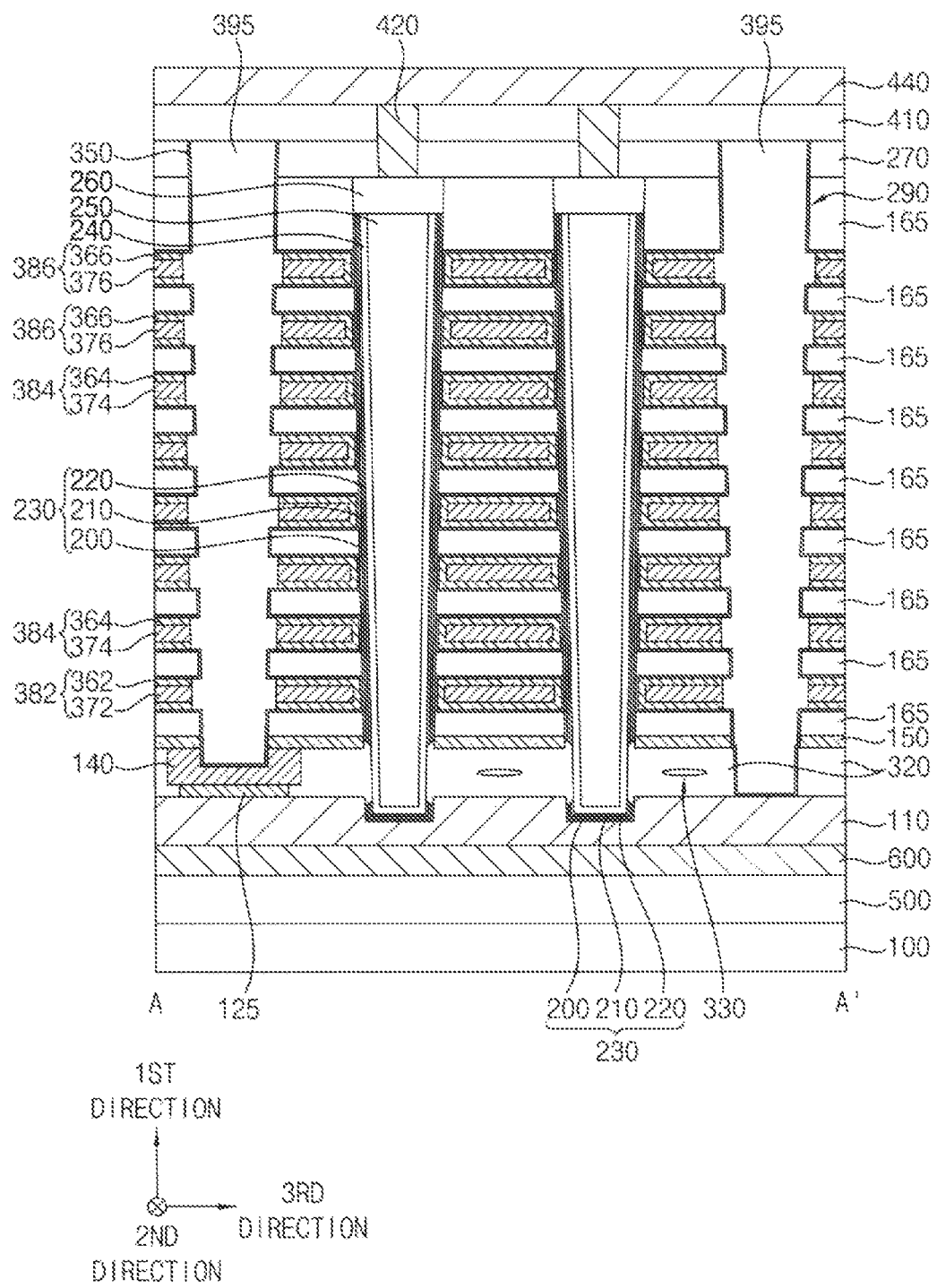
FIG. 21 is a cross-sectional view illustrating a vertical memory device in accordance with example embodiments.

FIG. 21 is a cross-sectional view illustrating a vertical memory device in accordance with example embodiments. FIG. 21 is a cross-sectional view taken along a line A-A' of FIG. 1.

This vertical memory device may be substantially the same as that of FIG. 20, except for a CSL plate. Thus, like reference numerals refer to like elements, and detailed descriptions thereon are omitted herein.

Referring to FIG. 21, the vertical memory device may further include a CSL plate 600 between the lower insulating interlayer 500 and the first etch stop layer 110, and no CSL may be formed in the opening 290.

Thus, a third spacer 395 may be formed in the opening 290, and may fill the opening 290 entirely.

The CSL plate 600 may be electrically connected to circuit patterns covered by the lower insulating interlayer 500, and may be also electrically connected to the first etch stop layer 110. The CSL plate 600 may include a metal, e.g., tungsten, or a metal silicide, e.g., tungsten silicide.

In example embodiments, the first etch stop layer 110 may include polysilicon doped with n-type impurities and carbon, or polysilicon doped with n-type impurities.

While example embodiments have been particularly shown and described, it will be understood by one of ordinary skill in the art that variations in form and detail may be made therein without departing from the spirit and scope of the claims.

What is claimed is:

1. A vertical memory device, comprising:
    first, second and third impurity regions sequentially stacked in a first direction substantially perpendicular to an upper surface of a substrate;
    a gate electrode structure including gate electrodes spaced apart from each other in the first direction on the third impurity region;
    a channel extending through the gate electrode structure, the second and third impurity regions, and an upper portion of the first impurity region on the substrate in the first direction;
    a charge storage structure covering a portion of an outer sidewall and a lower surface of the channel,
    wherein the channel directly contacts a sidewall of the second impurity region; and
    a support pattern between a top surface of the first impurity region and a lower surface of the third impurity region, wherein an upper surface of the support pattern contacts an edge of the lower surface of the third impurity region.

2. The vertical memory device of claim 1, wherein the first and third impurity regions include carbon and polysilicon doped with n-type impurities, and the second impurity region includes polysilicon doped with n-type impurities.

3. The vertical memory device of claim 1, wherein the first and third impurity regions include carbon and polysilicon doped with p-type impurities, and the second impurity region includes polysilicon doped with p-type impurities.

4. The vertical memory device of claim 1, wherein the support pattern includes polysilicon doped with carbon.

5. The vertical memory device of claim 1, further comprising a diffusion prevention pattern between the first impurity region and the support pattern, the diffusion prevention pattern configured to prevent impurities doped in the first impurity region from diffusing to neighboring layers.

6. The vertical memory device of claim 5, wherein the diffusion prevention pattern includes an oxide or a nitride.

7. The vertical memory device of claim 1, further comprising a common source line (CSL) on the first impurity region and the support pattern, the CSL extending in the first direction.

8. The vertical memory device of claim 7, wherein the CSL includes a plurality of CSLs spaced apart from each other in a third direction, each of the CSLs extends in a second direction substantially parallel to the upper surface of the substrate, the third direction being substantially parallel to the upper surface of the substrate and substantially perpendicular to the second direction, and
    wherein the support pattern covers a portion of a lower surface of each of the CSLs.

9. The vertical memory device of claim 8, wherein the support pattern includes a plurality of support patterns spaced apart from each other in the second direction under each of the CSLs.

10. The vertical memory device of claim 1, wherein the second impurity region directly contacts an outer sidewall of the third impurity region facing an outer sidewall of the channel.

11. The vertical memory device of claim 10, wherein the charge storage structure includes a first portion higher than the second impurity region and a second portion lower than the second impurity region, and
    a lower surface of the first portion is higher as a distance from the channel increases, and an upper surface of the second portion is lower as a distance from the channel increases.

12. The vertical memory device of claim 1, wherein the second impurity region includes an air gap therein.

13. The vertical memory device of claim 1, further comprising an insulating interlayer between the substrate and the first impurity region.

14. The vertical memory device of claim 13, wherein the insulating interlayer covers a circuit pattern on the substrate.

15. A vertical memory device, comprising:
- first, second and third impurity regions sequentially stacked in a first direction substantially perpendicular to an upper surface of a substrate;
- a gate electrode structure including gate electrodes spaced apart from each other in the first direction on the third impurity region;
- a channel extending through the gate electrode structure and the second and third impurity regions on the substrate in the first direction, at least a portion of the channel contacting the second impurity region;
- a charge storage structure covering a portion of an outer sidewall of the channel; and
- a support pattern between an upper surface of the first impurity region and a lower surface of the third impurity region, the support pattern contacting a sidewall of the second impurity region and an upper surface of the support pattern contacting an edge of the lower surface of the third impurity region.

16. The vertical memory device of claim 15, wherein the support pattern includes polysilicon doped with carbon.

17. The vertical memory device of claim 15, further comprising a diffusion prevention pattern between the first impurity region and the support pattern, the diffusion prevention pattern configured to prevent impurities doped in the first impurity region from diffusing to neighboring layers.

18. A vertical memory device, comprising:
- an impurity region structure on a substrate, the impurity region structure including polysilicon doped with impurities, and including first, second, and third impurity regions sequentially stacked;
- a gate electrode structure including gate electrodes spaced apart from each other in a first direction on the impurity region structure, the first direction being substantially perpendicular to an upper surface of the substrate;
- a channel extending through the gate electrode structure and at least a portion of the impurity region structure on the substrate in the first direction, a first portion of an outer sidewall of the channel directly contacting the impurity region structure;
- a charge storage structure covering a second portion of the outer sidewall and a lower surface of the channel, the second portion not directly contacting the impurity region structure; and
- a support pattern between a top surface of the first impurity region and a lower surface of the third impurity region, wherein an upper surface of the support pattern contacts an edge of the lower surface of the third impurity region.

* * * * *